United States Patent [19]

Okajima

[11] Patent Number: 5,793,680
[45] Date of Patent: Aug. 11, 1998

[54] INPUT BUFFER CIRCUIT, INTEGRATED CIRCUIT DEVICE, SEMICONDUCTOR MEMORY, AND INTEGRATED CIRCUIT SYSTEM COPING WITH HIGH-FREQUENCY CLOCK SIGNAL

[75] Inventor: Yoshinori Okajima, Kawasaki, Japan

[73] Assignee: Fujitsu Limited, Kanagawa, Japan

[21] Appl. No.: 766,173

[22] Filed: Dec. 12, 1996

[30] Foreign Application Priority Data

Jul. 9, 1996 [JP] Japan .................................. 8-179550

[51] Int. Cl.$^6$ .......................... G11C 16/04; G11C 7/00; G11C 8/00
[52] U.S. Cl. ...................... 365/189.05; 365/226; 365/233
[58] Field of Search ................... 365/189.05, 226, 365/233

[56] References Cited

U.S. PATENT DOCUMENTS 5,608,687  3/1997  Komarek et al. ............... 365/189.05

Primary Examiner—David C. Nelms
Assistant Examiner—Trong Pham
Attorney, Agent, or Firm—Nikaido Marmelstein Murray & Oram LLP

[57] ABSTRACT

An input buffer circuit includes a first amplifier causing a first change in an output signal by detecting a rising edge of an input signal, a second amplifier causing a second change in the output signal by detecting a falling edge of the input signal, and a feedback path feeding back the output signal as a feedback signal to the first amplifier and the second amplifier. The feedback signal controls the second amplifier such that a timing of the first change only depends on the first amplifier, and controls the first amplifier such that a timing of the second change only depends on the second amplifier.

16 Claims, 22 Drawing Sheets

F I G. 1 2
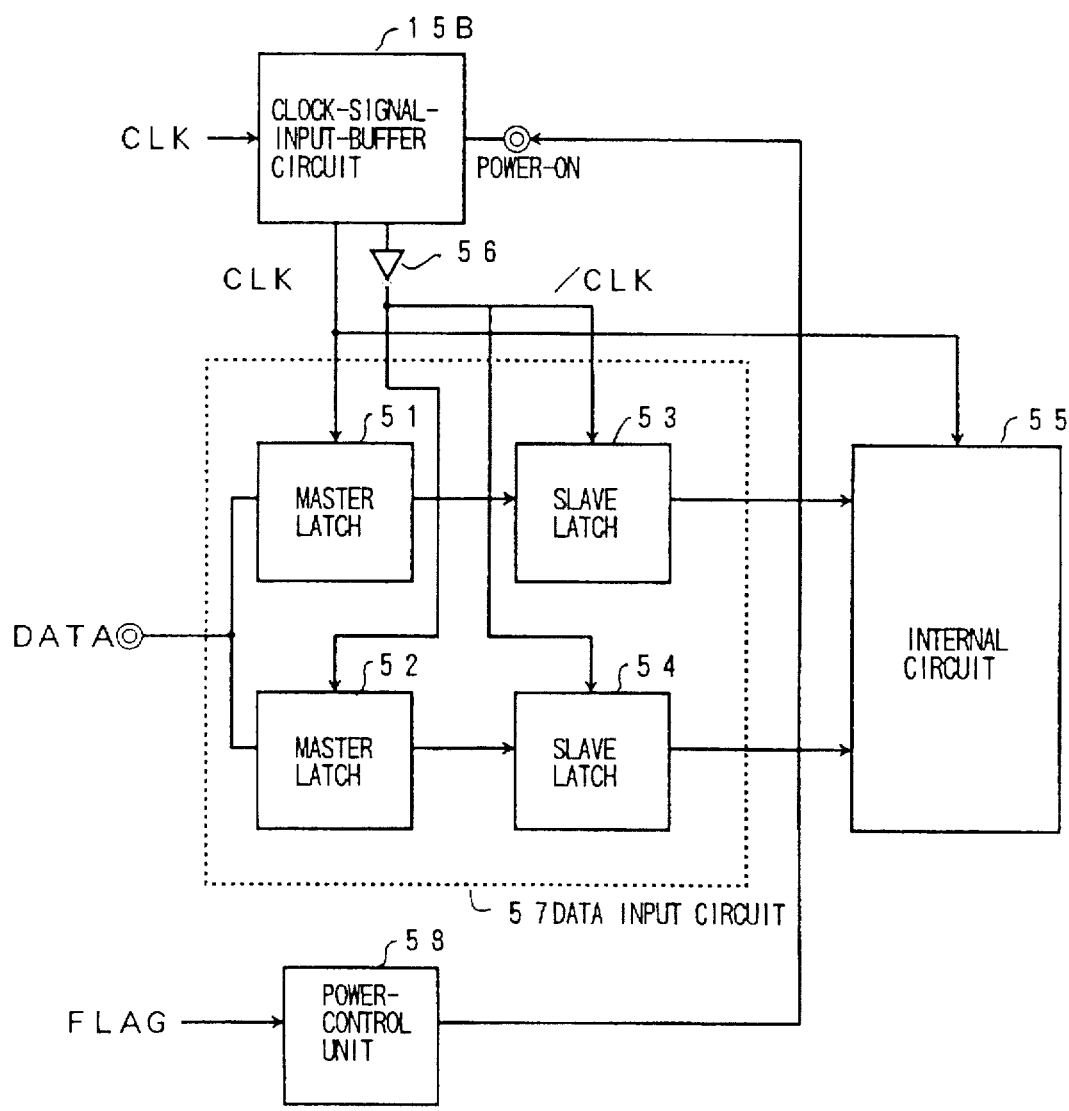

FIG. 13A FLAG 
FIG. 13B CLK 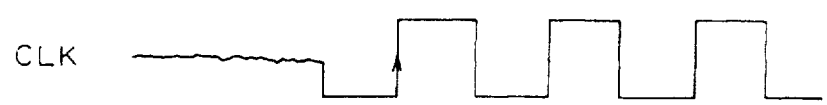
FIG. 13C FLAG 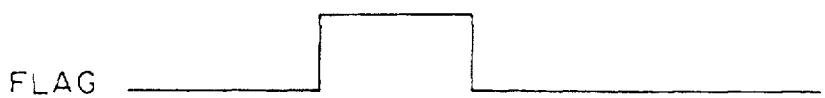
FIG. 13D CLK 

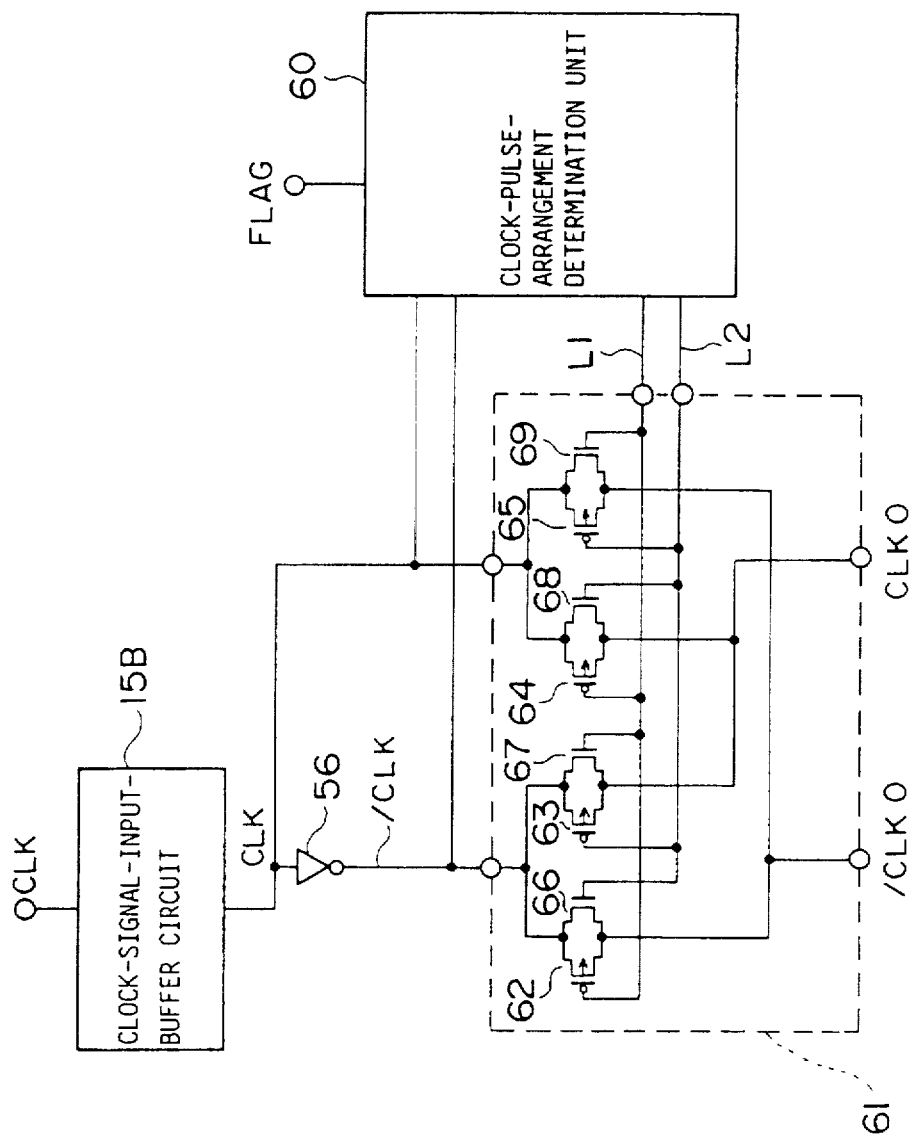

FIG. 18A DD-FLAG
FIG. 18B ECLK
FIG. 18C DD-FLAG
FIG. 18D ECLK

INPUT BUFFER CIRCUIT, INTEGRATED CIRCUIT DEVICE, SEMICONDUCTOR MEMORY, AND INTEGRATED CIRCUIT SYSTEM COPING WITH HIGH-FREQUENCY CLOCK SIGNAL

BACKGROUND OF THE INVENTION

1. Field of the Invention

The present invention generally relates to input circuits of semiconductor devices, and particularly relates to an input circuit of a semiconductor circuit operating at high speed by using a high signal frequency.

2. Description of the Related Art

FIG. 1 is a circuit diagram showing an example of a related-art input buffer used in semiconductor devices. This input buffer employs a current-mirror amplifier which includes P-type FETs (field-effect transistors) 1 and 2 and N-type FETs 3 through 5. The input buffer further includes inverters 6 through 8 connected in series at point A provided on the drain side of the N-type FET 3. The inverters 6 through 8 serve as a driver buffer for an output node Out. The current-mirror amplifier is switched on or off depending on a voltage applied to a power node POWER-on.

A clock signal CLK input to an input node CLK-in is compared with reference voltage Vref applied to a reference voltage node. When a voltage of the clock signal CLK is higher than the reference voltage Vref, a voltage at the point A becomes LOW. The inverters 6 through 8 invert the signal at the point A to produce a HIGH signal at the output node Out. When the clock signal CLK has a lower voltage than the reference voltage Vref, a HIGH voltage appears at the point A. This HIGH voltage is inverted by the inverters 6 through 8 to produce a LOW signal at the output node Out.

FIG. 2 is a time chart showing relations between the clock signal CLK, the voltage at the point A, and the reference voltage Vref during the operation of the input buffer.

The input buffer of FIG. 1 has a problem in that an increase in the clock frequency or a decrease in electric-current margins may result in malfunction of the input buffer. As shown in FIG. 2, a gate voltage (clock signal CLK) of the N-type FET 3 maintains a phase substantially opposite to that of the drain voltage (voltage at the point A) of the N-type FET 3, so that a signal degradation at the point A becomes apparent due to parasitic capacitance between the gate and the drain when the clock signal CLK increases its frequency.

FIG. 3 is a time chart showing this signal degradation. In the example of FIG. 3, this signal degradation at the point A appears only as a reduction in the electric-current margins. A further increase in the frequency of the clock signal CLK, however, will further deteriorate the signal at the point A as much as making the signal indistinguishable from noises. Even if only a reduction in the electric-current margins is present as shown in FIG. 3, the inverter 6 taking the signal of the point A as an input may not operate to produce expected results.

Accordingly, there is a need for an input-buffer circuit which can cope with a high-frequency clock input. Such an input-buffer circuit makes it possible to form systems of various configurations which were not possible before.

Accordingly, there is a further need in the field for various system configurations which can cope with use of a high-frequency clock signal.

SUMMARY OF THE INVENTION

Accordingly, it is a general object of the present invention to provide an input-buffer circuit and system configurations which can satisfy the needs described above.

It is another and more specific object of the present invention to provide an input-buffer circuit which can cope with a high-frequency clock input.

In order to achieve the above objects according to the present invention, an input-buffer circuit includes a first amplifier causing a first change in an output signal by detecting a rising edge of an input signal, a second amplifier causing a second change in the output signal by detecting a falling edge of the input signal, and a feedback path feeding back the output signal as a feedback signal to the first amplifier and the second amplifier. The feedback signal controls the second amplifier such that a timing of the first change only depends on the first amplifier, and controls the first amplifier such that a timing of the second change only depends on the second amplifier.

The device described above uses the first amplifier dedicated for detecting the rising edge of the input signal, and uses the second amplifier dedicated for detecting the falling edge of the input signal, with the feedback signal controlling the first amplifier and the second amplifier such that the timing of edge detection only depends on an operation of one of the amplifiers currently detecting an edge. Since the dedicated first amplifier and the dedicated second amplifier can detect edges without an interference from each other, an accurate detection of the rising edges and the falling edges can be achieved even when a high-frequency signal is used as the input signal.

It is still another object of the present invention to provide various system configurations which can cope with use of a high-frequency clock signal.

In order to achieve the above object according to the present invention, an integrated-circuit device receiving a first input signal includes a first amplifier causing a first change in a detection signal by detecting a rising edge of the first input signal, a second amplifier causing a second change in the detection signal by detecting a falling edge of the first input signal, a feedback path feeding back the detection signal as a feedback signal to the first amplifier and the second amplifier, the feedback signal controlling the second amplifier such that a timing of the first change only depends on the first amplifier, and controlling the first amplifier such that a timing of the second change only depends on the second amplifier, and a circuit operating in synchronism with changes in the detection signal corresponding to the first change and the second change.

The integrated-circuit device described above can use both the rising edges and the falling edges of a clock signal (the first input signal) for effecting synchronization of the circuit, so that a maximum operation frequency of the circuit can be equal to the frequency of the clock signal. Such a configuration achieves a high-speed operation of the integrated-circuit device.

In order to achieve the aforementioned object according to the present invention, an integrated-circuit device includes a first clock-input circuit receiving a first clock signal, a first data-input circuit receiving a first data signal in synchronism with the first clock signal, a second clock-input circuit receiving a second clock signal, a second data-input circuit receiving a second data signal in synchronism with the second clock signal, and a control circuit controlling a timing to start receiving the second data signal based on a timing to start receiving the first data signal.

When using the integrated-circuit device described above, the first clock signal can be used for inputting address/command signals, and is provided separately from the second clock signal which can be used for inputting/ outputting data signals. Since the second clock signal is provided for exclusive use for data input/output, the first clock signal is not required to be in synchronism with the data signals.

Further, the control of the timing to start receiving the second data signal is determined based on the timing to start receiving the first data signal, so that timing control between the two systems synchronized to the two separate clock signals can be maintained.

Other objects and further features of the present invention will be apparent from the following detailed description when read in conjunction with the accompanying drawings.

BRIEF DESCRIPTION OF THE DRAWINGS

FIG. 12 is a block diagram of a device which is provided with means for obviating the problem of an intermediate voltage level in addition to the device of FIG. 10;

FIGS. 13A through 13D are time charts showing timing relations between a control signal and the clock signal;

FIG. 14 is a circuit diagram of a circuit which reverses a phase relation of the clock signal supplied to internal elements depending on whether a latching operation starts at a rising edge or a falling edge;

DESCRIPTION OF THE PREFERRED EMBODIMENTS

In the following, a principle and embodiments of the present invention will be described with reference to the accompanying drawings.

Figure 4:
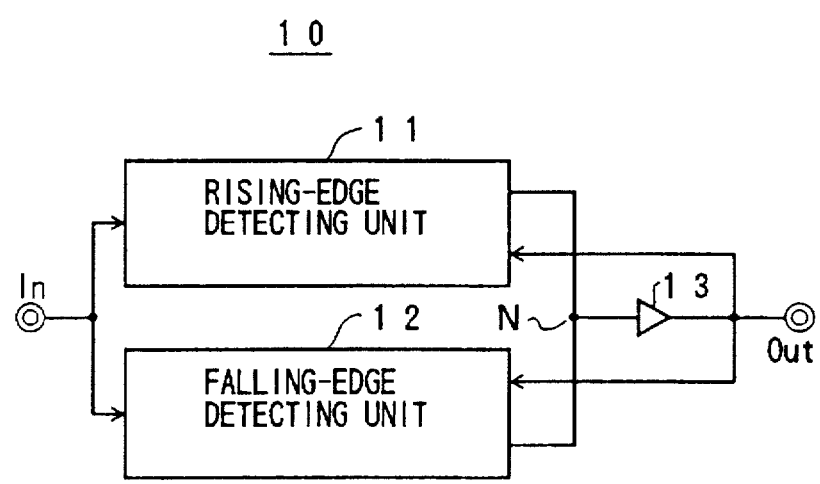
FIG. 4 is an illustrative drawing showing an input-buffer circuit according to a principle of the present invention.

FIG. 4 is an illustrative drawing showing an input-buffer circuit according to the principle of the present invention. The input-buffer circuit 10 of FIG. 4 includes a rising-edge detecting unit 11, a falling-edge detecting unit 12, and a gate 13.

The rising-edge detecting unit 11 detects a rise in the clock signal CLK which is input to the input node In, and changes a voltage level at point N to HIGH. The falling-edge detecting unit 12 detects a fall in the clock signal CLK provided at the input node In, and switches a voltage level at the point N to LOW. The gate 13 supplies the signal appearing at the point N to an output node Out with some delay, and feeds the delayed signal back to the rising-edge detecting unit 11 and the falling-edge detecting unit 12.

This feedback signal is used for controlling electric-current consumption of internal circuits of the rising-edge detecting unit 11 and the falling-edge detecting unit 12. The feedback signal controls the rising-edge detecting unit 11 and the falling-edge detecting unit 12, such that a rise in the voltage at the point N is dependent only on an operation of the rising-edge detecting unit 11, and a fall in the voltage at the point N is only dependent on an operation of the falling-edge detecting unit 12.

Figure 5:
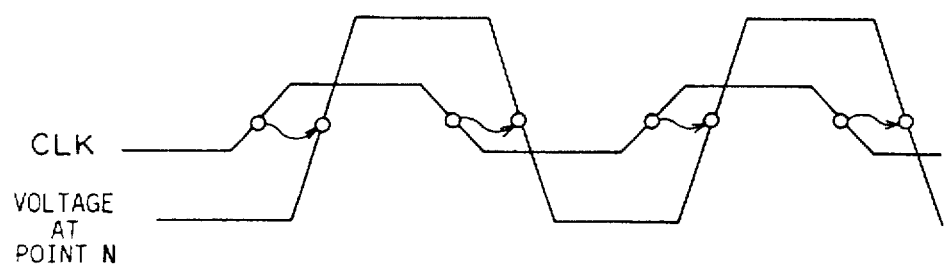
FIG. 5 is a time chart showing relations between a clock signal and a voltage at point N in the circuit of FIG. 4.

FIG. 5 is a time chart showing relations between the clock signal CLK and the voltage at the point N in the circuit of FIG. 4. As shown in FIG. 5, a rise of the clock signal CLK is detected by the rising edge detecting unit 11, which changes the voltage at the point N to HIGH. In response to the change to HIGH of the voltage of the point N, a HIGH signal delayed by the gate 13 is fed back to the rising-edge detecting unit 11. This fed-back HIGH signal controls the current amount of the internal circuit of the rising-edge detecting unit 11 to such an extent that the voltage at the point N does not change. The falling-edge detecting unit 12 detects a fall of the clock signal CLK to change the voltage at the point N to LOW. Upon the switching to LOW of the voltage at the point N, the gate 13 feeds back a delayed LOW signal to the falling-edge detecting unit 12. The current amount of the internal circuit of the falling-edge detecting unit 12 is controlled by the fed-back LOW signal to such an extent that the voltage at the point N does not change.

The control of the current amounts of the internal circuits makes a rise in the voltage at the point N only dependent on the operation of the rising-edge detecting unit 11, and makes a fall in the voltage at the point N only dependent on the falling-edge detecting unit 12. A detailed description of this control will be provided below.

The point N is a connection point between the rising-edge detecting unit 11 and the falling-edge detecting unit 12 arranged in a parallel connection. When the voltage at the point N is HIGH, for example, an output of the rising-edge detecting unit 11 is HIGH and an output of the falling-edge detecting unit 12 is floating (with a high output impedance). Then, the falling-edge detecting unit 12 detects a fall in the clock signal CLK to lower the voltage at the point N. In doing so, the falling-edge detecting unit 12 should produce a LOW output, and the rising-edge detecting unit 11 should make its output float. The timing of the voltage at the point N changing to LOW should be dominated only by the falling-edge detecting unit 12. To achieve this, the output of the rising-edge detecting unit 11 is preferably turned into such an output state that maintains a HIGH level but will not impede a change in the output of the falling-edge detecting unit 12, before the output of the falling-edge detecting unit 12 is actually changed to LOW.

In order to achieve this output state, the output of the rising-edge detecting unit 11 may be coupled to a HIGH level via a high impedance, after the rising-edge detecting unit 11 detecting the rise in the clock signal CLK changes its output to the HIGH level. This coupling is achieved under the control of the feedback signal. Since the output of the falling-edge detecting unit 12 is still floating at this point, the voltage at the point N still maintains the HIGH level. Detecting the fall in the clock signal CLK, then, the falling-edge detecting unit 12 changes its output from a floating state to the LOW level (coupling the output to the ground). Since the rising-edge detecting unit 11 has been barely keeping its output at the HIGH level via the high impedance, the LOW output (coupled to the ground) of the falling-edge detecting unit 12 makes the voltage at the point N substantially LOW. In this manner, the timing of the fall in the voltage at the point N is dominated only by the falling-edge detecting unit 12.

Likewise, the output of the falling-edge detecting unit 12 is coupled to the LOW level via a high impedance based on the feedback signal, after the falling-edge detecting unit 12 changes its output to LOW by detecting a falling edge of the clock signal CLK. By doing so, the timing of a rise in the voltage at the point N is only dependent on the operation of the rising-edge detecting unit 11.

In this manner, the rising-edge detecting unit 11 and the falling-edge detecting unit 12 can provide accurate detections of rising edges and falling edges.

Control of the electric current in the rising-edge detecting unit 11 also allows the rising-edge detecting unit 11 to prepare to give a quick response to a change to LOW at a next clock timing, after the rising-edge detecting unit 11 detects a rise in the clock signal CLK. Likewise, after detecting a fall in the clock signal CLK, the falling-edge detecting unit 12 can be well prepared for a change to HIGH at a next clock timing to provide a quick response. Such electric-current control also help to reduce excessive power consumption in the rising-edge detecting unit 11 and the falling-edge detecting unit 12.

Figure 6:
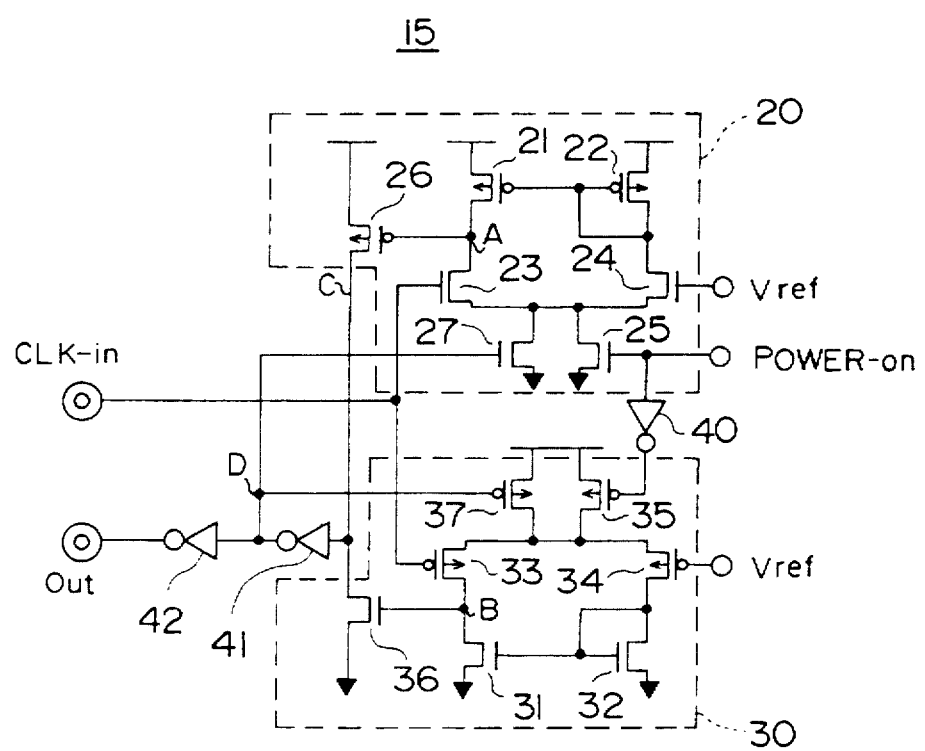
FIG. 6 is a circuit diagram showing a first embodiment of the input-buffer circuit according to the principle of the present invention.

FIG. 6 is a circuit diagram showing a first embodiment of the input-buffer circuit according to the principle of the present invention. An input-buffer circuit 15 of FIG. 6 includes a rising-edge detecting unit 20, a falling-edge detecting unit 30, a power-supply-portion inverter 40, and output-portion inverters 41 and 42. The power-supply-portion inverter 40 inverts a power voltage applied to a power node POWER-on, and supplies the inverted power signal to the falling-edge detecting unit 30. The falling-edge detecting unit 30 operates when this inverted power signal is at a LOW level. The output-portion inverters 41 and 42 correspond to the gate 13 of FIG. 4.

The rising-edge detecting unit 20 includes a current-mirror amplifier comprising P-type FETs 21 and 22 and N-type FETs 23 through 25, a P-type FET 26 receiving an output of the current-mirror amplifier as a gate input, and an N-type FET 27 controlling the amount of electric current of the current-mirror amplifier. A clock signal CLK supplied to a clock-input node CLK-in is input to the current-mirror amplifier, whose output controls the P-type FET 26 as to whether it is turned on or off.

The falling-edge detecting unit 30 includes a current-mirror amplifier comprising N-type FETs 31 and 32 and P-type FETs 33 through 35, an N-type FET 36 receiving an output of the current-mirror amplifier as a gate input, and a P-type FET 37 for controlling the current amount of the current-mirror amplifier. The clock signal CLK provided at the clock-input node CLK-in is input to the current-mirror amplifier, whose output controls on/off of the N-type FET 36.

A drain of the P-type FET 26 is connected to a drain of the N-type FET 36, and a point connecting between the P-type FET 26 and the N-type FET 36 provides a common output of the rising-edge detecting unit 20 and the falling-edge detecting unit 30. This common output is supplied to the output-portion inverter 41. An output of the output-portion inverter 41 is provided as a gate input to the N-type FET 27 for current control of the rising-edge detecting unit 20 and to the P-type FET 37 for current control of the falling-edge detecting unit 30. Also, the output of the output-portion inverter 41 is inverted by the output-portion inverter 42 to be supplied as an output signal of the input-buffer circuit 15 at an output node Out.

Figure 7:
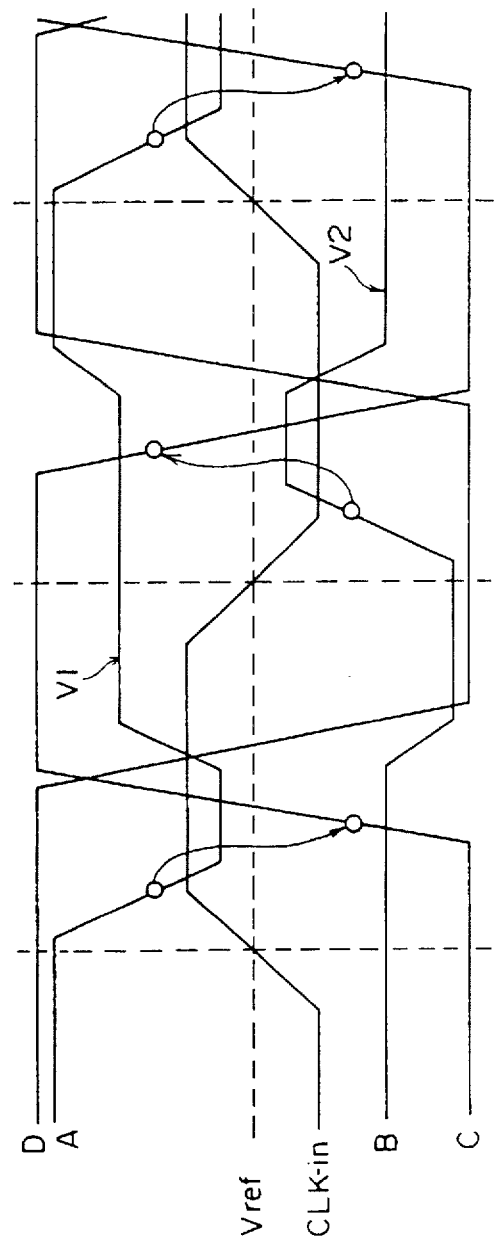
FIG. 7 is a time chart showing voltage changes at points A through D shown in FIG. 6.

FIG. 7 is a time chart showing voltage changes at points A through D shown in FIG. 6. As shown in FIG. 7, upon a rise in the clock signal CLK, voltage A (voltage at the point A), which is the output of the current-mirror amplifier of the rising-edge detecting unit 20, has a fall. In response, the P-type FET 26 of the rising-edge detecting unit 20 is turned on, so that the voltage C (voltage at the point C), which is the output of the rising-edge detecting unit 20, has a rise. Namely, the rising-edge detecting unit 20 detects the rise of the clock signal CLK, and changes its output (voltage C) to HIGH.

As the voltage C becomes HIGH, voltage D (voltage at the point D), which is the output of the output-portion inverter 41, is turned to LOW with some delay. Receiving the voltage D as a feedback signal, the rising-edge detecting unit 20 turns off the N-type FET 27, which is provided for current control of the rising-edge detecting unit 20. The turning off of the N-type FET 27 results in a reduction in the current amount of the current-mirror amplifier of the rising-edge detecting unit 20, thereby partially raising the voltage A up to voltage level Vi as shown in FIG. 7. With this voltage level V1, the P-type FET 26 maintains a weak turned-on state. The point C which is the output of the rising-edge detecting unit 20 is thus coupled to the HIGH voltage level via a high internal resistance of the P-type FET 26. As a result, the voltage C remains at the HIGH level.

Upon a change to LOW of the clock signal CLK, the voltage B (voltage at the point B), which is the output of the current-mirror amplifier of the falling-edge detecting unit 30, is raised. In response, the N-type FET 36 of the falling-edge detecting unit 30 is turned on to bring about a fall in the voltage C, which is the output of the falling-edge detecting unit 30. Namely, the falling-edge detecting unit 30 detects the fall of the clock signal CLK to turn its output, the voltage C, to LOW. At this point of time, the output of the rising-edge detecting unit 20 is coupled to the HIGH voltage level via the high internal resistance of the P-type FET 26 which is in the weak turn-on state. Therefore, timing of the fall in the voltage C is determined solely by the operation of the falling-edge detecting unit 30.

As the voltage C becomes LOW, voltage D output from the output-portion inverter 41 is turned to HIGH after some delay. Receiving the voltage D as a feedback signal, the falling-edge detecting unit 30 turns off the P-type FET 37, which is provided for current control of the falling-edge detecting unit 30. The turning off of the P-type FET 37 results in a reduction in the current amount of the current-mirror amplifier of the falling-edge detecting unit 30, thereby partially lowering the voltage B down to voltage level V2 as shown in FIG. 7. With this voltage level V2, the N-type FET 36 maintains a weak turned-on state. The point C which is the output of the falling-edge detecting unit 30 is thus coupled to the LOW voltage level via a high internal resistance of the N-type FET 36. As a result, the voltage C remains at the LOW level. When the clock signal CLK is turned to HIGH at the next timing, the operation of the rising-edge detecting unit 20 will solely determine the timing of the rise in the voltage C.

In this manner, the input-buffer circuit 15 according to the first embodiment accurately detects rising edges and falling edges. Also, the current control by the feedback signal allows the rising-edge detecting unit 20 to prepare to produce a quick response to a change to LOW at the next clock timing after detecting a rising edge of the clock signal CLK. Likewise, the falling-edge detecting unit 30, after detecting a falling edge of the clock signal CLK, can provide a quick response to a transition to HIGH which will be made at the next clock timing. In this manner, the input-buffer circuit 15 achieves a stable operation under a high operation frequency.

Figure 8:
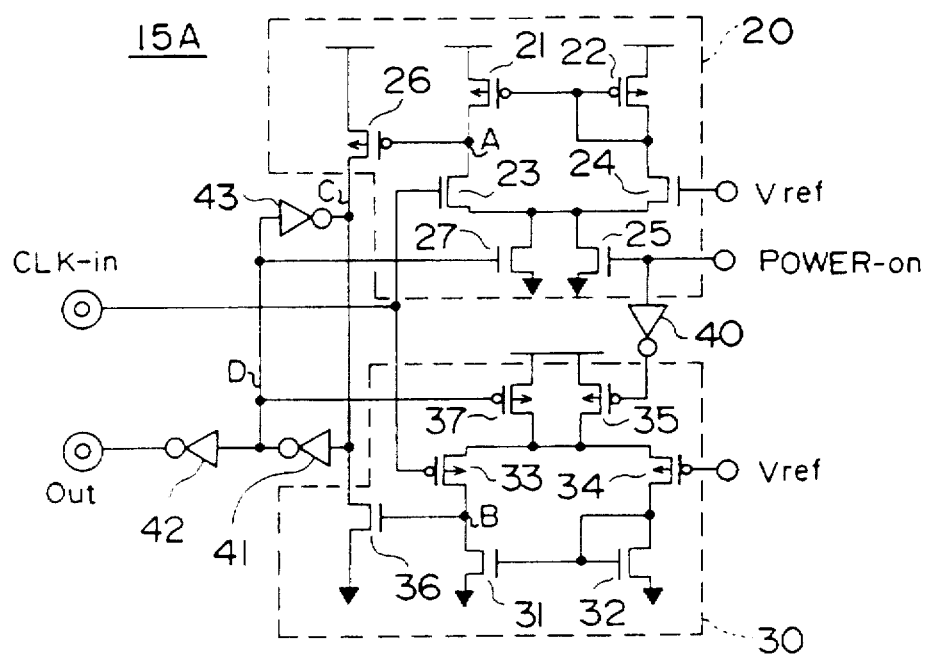
FIG. 8 is a circuit diagram showing a variation of the first embodiment of the input-buffer circuit according to the present invention.

FIG. 8 is a circuit diagram showing a variation of the first embodiment of the input-buffer circuit according to the present invention. In FIG. 8, the same elements as those of FIG. 6 are referred to by the same numerals, and a description thereof will be omitted.

In the input-buffer circuit 15A of FIG. 8, an inverter 43 is provided in addition to the input-buffer circuit 15 of FIG. 6. The inverter 43 and the inverter 41 form a latch circuit for latching the voltage at the point C. This configuration enables the voltage C (voltage at the point C) to maintain the HIGH level even if the voltage level V1 of FIG. 7 goes up to a level which completely turns off the P-type FET 26 of the rising-edge detecting unit 20. Likewise, the voltage C can remain at the HIGH level even if the voltage level V2 of FIG. 7 goes down to a level which completely turns off the N-type FET 36 of the falling-edge detecting unit 30. Therefore, the operation of the circuit can be made more reliable. Further, even when the voltage applied to the power node POWER-on is turned off to cut the power supply, the data-latch function of the latch circuit serves to maintain the output signal level, thereby preventing malfunction of next-stage circuits.

Further, this configuration having the latch circuit can omit the N-type FET 25 and the P-type FET 35 which are driven by the voltage applied to the power node POWER-on, for example. The omission of these FETs achieves a further reduction in power consumption by completely cutting the power of the rising-edge detecting unit 20 and the falling-edge detecting unit 30 in turn based on the feedback signal.

Figure 9:
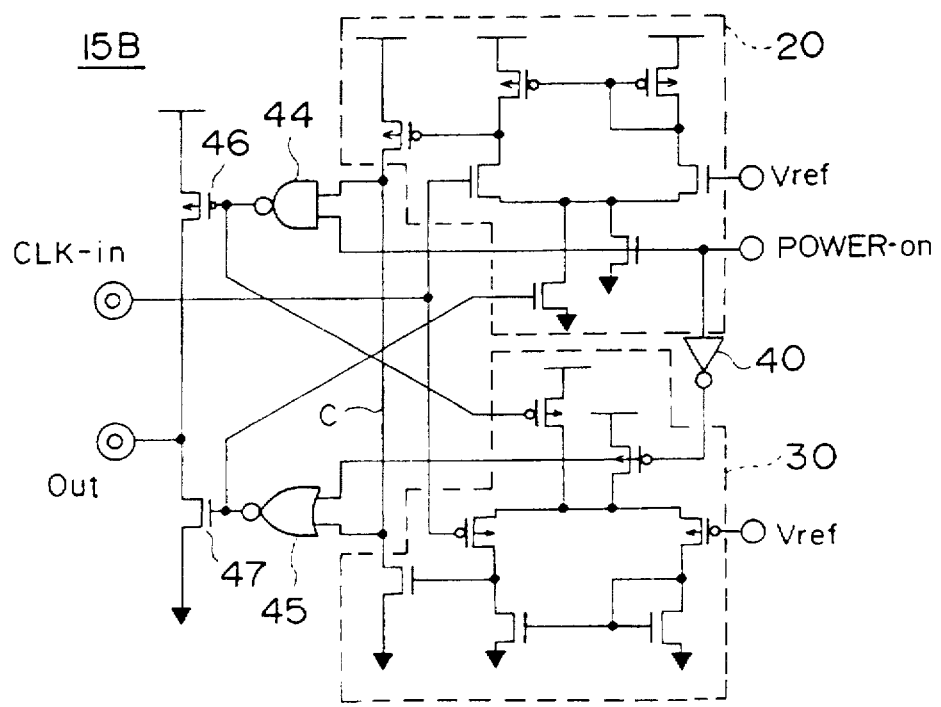
FIG. 9 is a circuit diagram of a second embodiment of the input-buffer circuit according to the principle of the present invention.

FIG. 9 is a circuit diagram of a second embodiment of the input-buffer circuit according to the principle of the present invention. In FIG. 9, the same elements as those of FIG. 6 are referred to by the same numerals, and a description thereof will be omitted.

In FIG. 9, the input-buffer circuit 15B includes the rising-edge detecting unit 20, the falling-edge detecting unit 30, a NAND circuit 44, a NOR circuit 45, a P-type FET 46, and an N-type FET 47.

The NAND circuit 44 receives at one input thereof the voltage C which is the output of the rising-edge detecting unit 20 and the falling-edge detecting unit 30, and receives at the other input thereof a signal which is applied to the power node POWER-on. The NOR circuit 45 receives at one input thereof the voltage C which is the output of the rising-edge detecting unit 20 and the falling-edge detecting unit 30, and receives at the other input thereof an inverse of the signal which is applied to the power node POWER-on.

When the power node POWER-on receives a HIGH voltage (power on), each of the NAND circuit 44 and the NOR circuit 45 serves as an inverter taking the voltage at the point C as its input. When the power node POWER-on is provided with a LOW voltage (power off), the NAND circuit 44 outputs HIGH at all times, and the NOR circuit 45 produces LOW at all times.

As a result, when the power is off, the P-type FET 46 and the N-type FET 47 are turned off, with no output voltage appearing at the output node Out provided between the drains of the P-type FET 46 and the N-type FET 47. That is, the output node Out is floating. In addition, the falling-edge detecting unit 30 receiving the output of the NAND circuit 44 as a feedback signal is completely cut from the power to be put into an inactive state, and, also, the rising-edge detecting unit 20 receiving the output of the NOR circuit 45 as a feedback signal is completely cut from the power to be put into an inactive state.

When the power is on, the voltage at the point C which is the output of the rising-edge detecting unit 20 and the falling-edge detecting unit 30 is inverted by the NAND circuit 44 and the NOR circuit 45, and the inverted signal is supplied to the gates of the P-type FET 46 and the N-type FET 47. Thus, when the voltage at the point C is HIGH, the output node Out produces a HIGH signal. On the other hand, when the voltage at the point C is LOW, the output node Out provides a LOW signal.

In summary, the input-buffer circuit 15B of FIG. 9 according to the second embodiment operates in the same manner as the input-buffer circuit 15 of FIG. 6 when the power is on. When the power is off, the rising-edge detecting unit 20 and the falling-edge detecting unit 30 are made inactive to reduce excessive power consumption, with the output node Out floating. In this manner, the on/off of the power voltage can control the input-buffer circuit 15B of the second embodiment as to whether it is active or inactive.

According to the principle of the present invention described above, the input-buffer circuit achieves accurate detection of rising edges and falling edges even when the input clock signal has a high frequency. The above description has been given by taking a clock input as an example, but it is apparent that the principle of the present invention can be applied to any input signal.

The use of the input-buffer circuit according to the present invention makes it possible to provide various system configurations which have been conventionally impossible. A description of such configurations will be given below.

Figure 10:
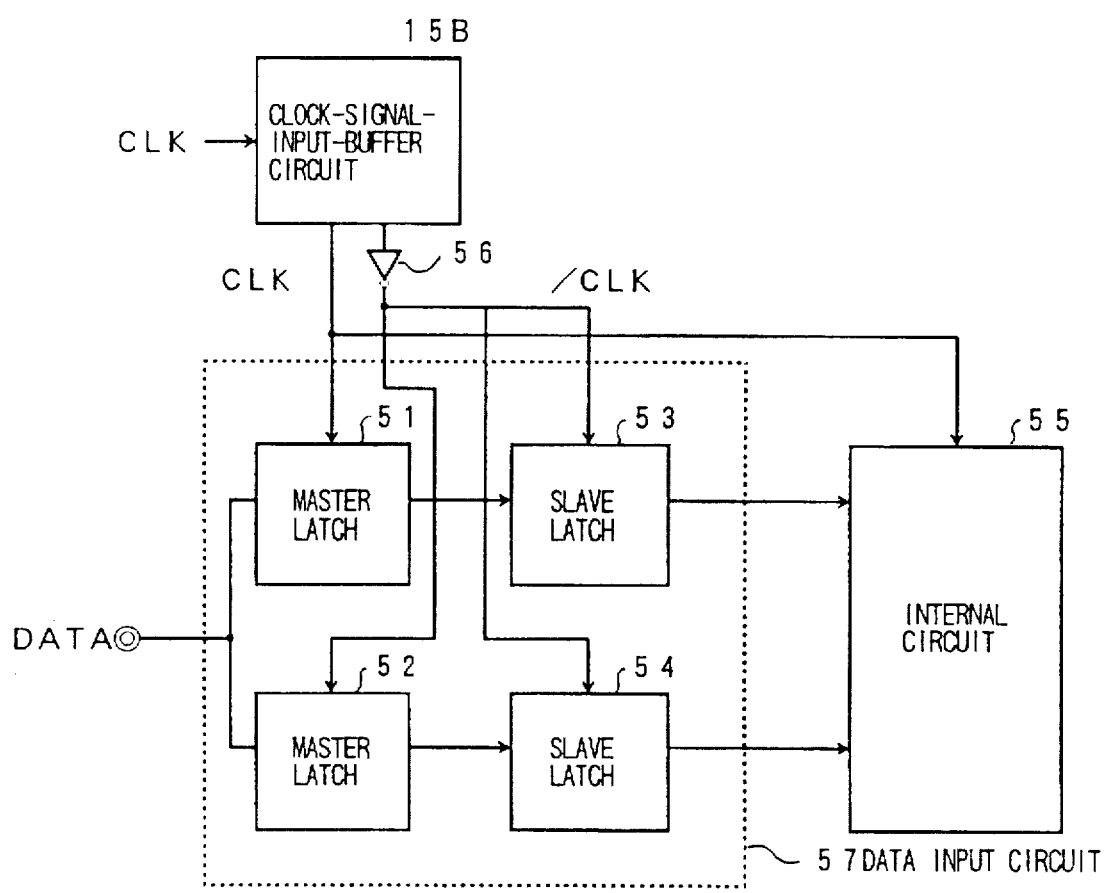
FIG. 10 is a block diagram of a device employing the input-buffer circuit of the present invention for clock-signal input.

FIG. 10 is a block diagram of a device employing the input-buffer circuit of the present invention for clock-signal input. A device 50 of FIG. 10 includes the clock-signalinput-buffer circuit 15B according to the principle of the present invention, master latches 51 and 52, slave latches 53 and 54, an internal circuit 55, and an inverter 56 for inverting a clock signal CLK. The clock-signal-input-buffer circuit 15B is the same as the input-buffer circuit 15B of FIG. 9, and a description thereof will be omitted. The master latches 51 and 52 and the slave latches 53 and 54 make up a data-input circuit 57 of a latch type.

Figure 1:
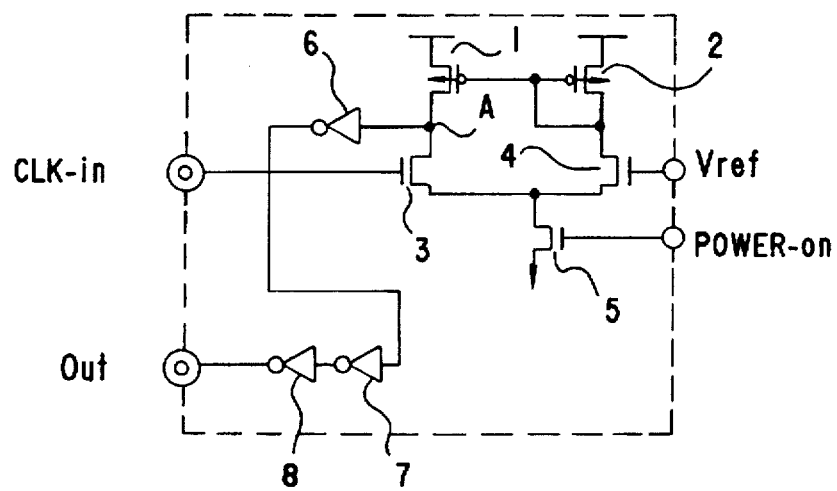
FIG. 1 is a circuit diagram showing an example of a related-art input buffer used in semiconductor devices.
Figure 2:
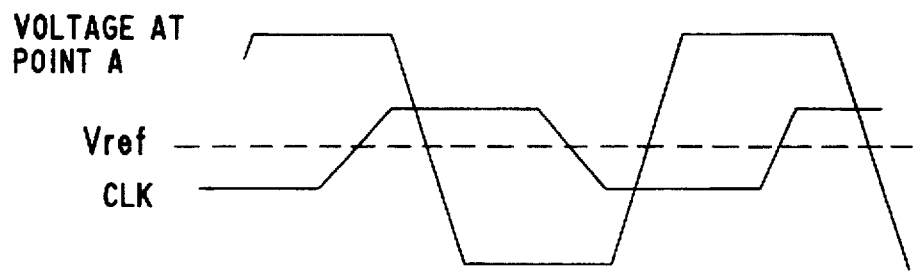
FIG. 2 is a time chart showing relations between a clock signal, a voltage at point A, and a reference voltage Vref during operation of the input buffer of FIG. 1.
Figure 3:
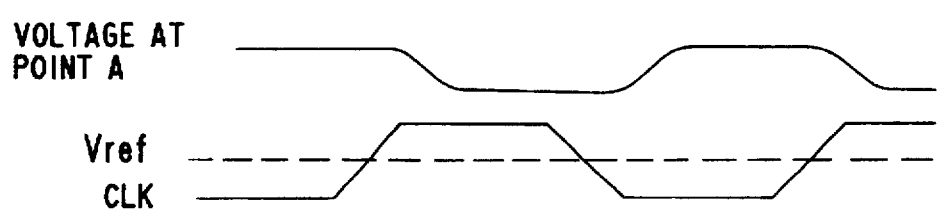
FIG. 3 is a time chart showing signal degradation detected by the input buffer.

The clock-signal-input-buffer circuit 15B is capable of providing accurate detection of rising edges and falling edges even if the input clock signal has a high frequency. An input-buffer circuit of the related art (e.g., FIG. 1) does not have sufficient precision in detection of falling edges even if the input-buffer circuit has satisfactory accuracy in detection of rising edges. Such an input-buffer circuit cannot provide timing of falling edges accurate enough to be used for timing control of data-input circuits or the like. In FIG. 10, however, the clock-signal-input-buffer circuit 15B is employed as an input-buffer circuit for receiving the clock-signal input, so that the falling edges of the clock signal CLK can be used for the timing control.

As shown in FIG. 10, the data-input circuit 57 is comprised of the latches 51 through 54. The configuration of FIG. 10 makes it possible to set an appropriate data-read timing to the data-input circuit 57 by using as a set-up time a delay of the clock signal CLK created by the clock-signal-input-buffer circuit 15B.

Each latch of the data-input circuit 57 latches input data at rising edges of a respective input clock supplied thereto. The master latch 51 receives the clock signal CLK to latch the input data at rising edges of the clock signal CLK. The slave latch 53 receives an inverse signal /CLK of the clock signal CLK (hereinafter the symbol "/" denotes an inverse) so as to latch the output of the master latch 51 at falling edges of the clock signal CLK. The master latch 52 receives the inverse signal /CLK of the clock signal CLK to latch the input data at falling edges of the clock signal CLK. The slave latch 54 receives the clock signal CLK so as to latch the output of the master latch 52 at rising edges of the clock signal CLK. In this manner, both the rising edges and the falling edges of the clock signal CLK are used as the data-read timing, so that data-read operations are conducted at double the frequency of the clock signal CLK.

As shown in FIG. 10, the input data latched by the data-input circuit 57 is supplied to the internal circuit 55. The internal circuit 55 is a core circuit and the like if the device of FIG. 10 is a RAM, for example. The clock signal CLK detected by the clock-signal-input-buffer circuit 15B is supplied to the internal circuit 55, which uses it for timing control.

A description with reference to FIG. 10 has been provided by taking the data-input circuit 57 as an example, but it is apparent that the clock-signal-input-buffer circuit 15B can be used in combination with any signal-input circuit. Further, a configuration similar to that of FIG. 10 can be used for signal-output circuits, in which both the rising edges and the falling edges are used for effecting synchronization between signals.

In the system such as shown in FIG. 10 using both the rising edges and the falling edges of the clock signal CLK for effecting synchronization, a maximum operation frequency of a signal-input/output system can be equal to the frequency of the clock signal CLK. Such a configuration has an advantage in that the designing of print boards for implementing systems become easier.

The clock-signal-input-buffer circuit 15B according to the principle of the present invention is suitable for data transmission using high-frequency signals, and, thus, can be used with high-speed-and-small-amplitude interface standard SSTL (stub series terminated logic), for example, which has been adopted as an industry standard by JEDEC (an organization affiliated to the Electronics Industries Association in the United States). Unfortunately, the SSTL has a problem in that a signal level becomes the same level as the reference voltage Vref during a power-down period of the system.

Figure 11:
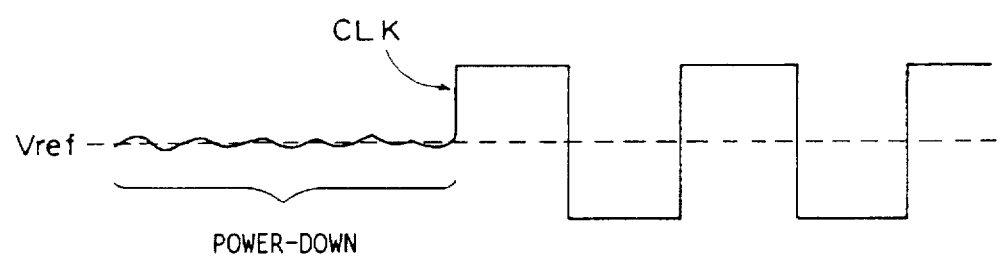
FIG. 11 is an illustrative drawing for explaining a problem of a clock signal becoming the same level as the reference voltage Vref.

FIG. 11 is an illustrative drawing for explaining the problem of the clock signal CLK becoming the same level as the reference voltage Vref. As shown in FIG. 11, the clock signal CLK has the same level as the reference voltage Vref during the power-down period, and includes small noises mixed from various causes. When such a clock signal CLK is input to the input-buffer circuit of the related art (e.g., FIG. 1), the input-buffer circuit might detect these small noises as signals to generate false clock pulses. The same problem can be observed in other input signals not only in the input clock signals.

This problem of an intermediate voltage level can be overcome by providing a control signal to control the on/off of the clock-signal-input-buffer circuit 15B of FIG. 9 according to the present invention. A method of overcoming this problem will be described below.

FIG. 12 is a block diagram of a device which is provided with means for obviating the problem of an intermediate voltage level in addition to the device of FIG. 10. In FIG. 12, the same element as those of FIG. 10 are referred to by the same numerals, and a description thereof will be omitted.

A device of FIG. 12 includes the clocksignal-input-buffer circuit 15B according to the principle of the present invention, the internal circuit 55, the inverter 56, the data-input circuit 57, and a power-control unit 58.

The power-control unit 58 receives control signal FLAG. The control signal FLAG indicates a timing when a clock-signal input starts.

FIGS. 13A through 13D are time charts showing timing relations between the control signal FLAG and the clock signal CLK. FIGS. 13A and 13B and FIGS. 13C and 13D show different timing relations between the control signal FLAG and the clock signal CLK. As shown in FIGS. 13A through 13D, the control signal FLAG is turned to HIGH at a timing when the clock signal CLK is changed from the level of the reference voltage Vref to genuine clock pulses.

The power-control unit 58 of FIG. 12 produces a LOW-level signal before the control signal FLAG is turned to HIGH. This LOW-level signal is applied to the power node POWER-on of the clock-signal-input-buffer circuit 15B. This puts the clock-signal-input-buffer circuit 15B into an initial inactive state. The clock-signal-input-buffer circuit 15B in the inactive state does not output false clock pulses even when an intermediate voltage level is supplied at its clock-signal input.

After the control signal FLAG is turned to HIGH, the power-control unit 58 generates a HIGH signal. This HIGH signal from the power-control unit 58 is supplied to the power node POWER-on of the clock-signal-input-buffer circuit 15B to activate it. Since the control signal FLAG is turned to HIGH at the start of the clock signal CLK, the clock-signal-input-buffer circuit 15B detects a genuine clock signal CLK, and provides the detected clock signal CLK to the internal circuit 55 and the data-input circuit 57.

In this manner, the control of the power on/off of the input circuit by the control signal can prevent the input circuit from detecting a signal having an intermediate voltage level in systems such as SSTL.

As shown in FIGS. 13A through 13D, there are two different timing relations between the clock signal CLK and the control signal FLAG. In the timing relation shown in FIGS. 13A and 13B, the data-input circuit 57 initiates the latching of the signal input at a rising edge of the clock signal CLK. In the timing relation shown in FIGS. 13C and 13D, the data-input circuit 57 starts latching the signal input at a falling edge of the clock signal CLK. In the system using both the rising edges and the falling edges as in the present invention, however, the rising edges and the falling edges are preferably treated indiscriminately from each other.

In order to achieve this indiscriminate treatment, the following settings are preferred. When the latching operation starts at the rising edge of the clock signal CLK as in FIGS. 13A and 13B, the clock signal CLK supplied to the internal circuit 55 and the data-input circuit 57 is preferably set to have the same phase as the input clock signal CLK. On the other hand, when the latching operation begins at the falling edge of the clock signal CLK as in FIGS. 13C and 13D, the clock signal CLK supplied to the internal circuit 55 and the data-input circuit 57 is desirably set to have the opposite phase as the input clock signal CLK.

FIG. 14 is a circuit diagram of a circuit which reverses the phase relation of the clock signal CLK supplied to internal elements depending on whether the latching operation starts at a rising edge or a falling edge.

The circuit of FIG. 14 includes the clock-signal-input-buffer circuit 15B of FIG. 9, a clock-pulse-arrangement determination unit 60, and a switch circuit 61. The clock-signal-input-buffer circuit 15B detects the input clock signal CLK, and outputs the clock signal CLK. The clock signal CLK from the clock-signal-input-buffer circuit 15B and an inverse clock signal/CLK inverted by the inverter 56 are supplied to the clock-pulse-arrangement determination unit 60 and the switch circuit 61.

The clock-pulse-arrangement determination unit 60 receives the control signal FLAG in addition to the clock signal CLK and the inverse clock signal/CLK. The clock-pulse-arrangement determination unit 60 ascertains whether the clock signal CLK changes from HIGH to LOW during the HIGH period of the control signal FLAG or changes from LOW to HIGH during the same period. With the clock signal CLK changing from HIGH to LOW, the clock-pulse-arrangement determination unit 60 supplies a HIGH signal at an output node L1 and a LOW signal at an output node L2. On the other hand, if the clock signal CLK changes from LOW to HIGH, the clock-pulse-arrangement determination unit 60 outputs a LOW signal at the output node L1 and a HIGH signal at the output node L2.

The switch circuit 61 includes P-type FETs 62 through 65 and N-type FETs 66 through 69 each having a parallel connection with a corresponding one of the P-type FETs 62 through 65. Each of the P-type FETs 62 and 64 and the N-type FETs 67 and 69 is provided with the output node L1 of the clock-pulse-arrangement determination unit 60 as a gate input. Each of the P-type FETs 63 and 65 and the N-type FETs 66 and 68 has a gate input thereof connected to the output node L2 of the clock-pulse-arrangement determination unit 60.

When the clock signal CLK changes from HIGH to LOW, the output node L1 becomes HIGH and the output node L2 becomes LOW, so that the P-type FETs 63 and 65 and the N-type FETs 67 and 69 are turned on. This results in an output node CLK0 of the switch circuit 61 producing the inverse clock signal/CLK and an output node/CLK0 providing the clock signal CLK.

When the clock signal CLK changes from LOW to HIGH, the output node L1 becomes LOW and the output node L2 becomes HIGH, so that the P-type FETs 62 and 64 and the N-type FETs 66 and 68 are turned on. This results in the output node CLK0 of the switch circuit 61 producing the clock signal CLK and the output node/CLK0 providing the inverse clock signal/CLK.

In this manner, the clock signal CLK supplied to internal circuits has a phase which is reversed depending on whether the latching operation starts at the rising edge or at the falling edge.

The clock-pulse-arrangement determination unit 60 of FIG. 14 ascertains whether the clock signal CLK changes from HIGH to LOW or changes from LOW to HIGH during the "on" period of the control signal FLAG.

Figure 15:
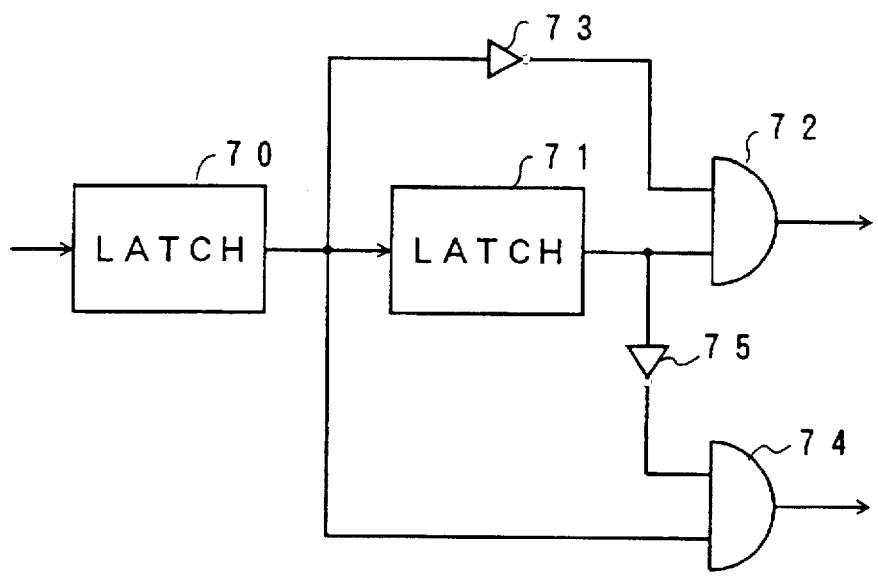
FIG. 15 is a circuit diagram of a circuit which ascertains changes of the clock signal.

FIG. 15 is a circuit diagram of a circuit which ascertains the changes of the clock signal. As shown in FIG. 15, a latch 70 and a latch 71 chronologically hold signal levels of the clock signal CLK which are input during the HIGH period of the control signal FLAG. Namely, with the clock signal CLK changing from HIGH to LOW, the latch 71 and the latch 70 hold HIGH and LOW, respectively. An output of the latch 71 is supplied to one input of an AND circuit 72, and an output of the latch 70 is supplied via an inverter 73 to the other input of the AND circuit 72. The output of the latch 70 is also supplied to one input of an AND circuit 74, and the output of the latch 71 is supplied via an inverter 75 to the other input of the AND circuit 74. In this case, therefore, the output of the AND circuit 72 is HIGH, and the output of the AND circuit 74 is LOW.

On the other hand, when the clock signal CLK turns from LOW to HIGH during the HIGH period of the control signal FLAG, the latch 71 and the latch 70 store LOW and HIGH, respectively. In this case, the AND circuit 72 produces a LOW output, and the AND circuit 74 provides a HIGH output.

In this manner, it can be ascertained whether the clock signal CLK changes from HIGH to LOW or from LOW to HIGH during the HIGH period of the control signal FLAG.

The device of FIG. 12 uses the control signal FLAG in order to obviate the problem of the intermediate voltage level. In FIG. 12, the control signal FLAG is provided externally, but there are cases in which the control signal FLAG needs to be generated internally. A description of such cases will be provided below.

In data-write operations of a memory device, for example, a controller provides a clock signal to the memory device, and also supplies an address signal to the memory device in synchronism with the clock signal. Further, the controller feeds a data signal to be stored to the memory device in synchronism with the clock signal. In general, the controller is connected to a large number of memory chips, so that it needs the help of buffers to supply the clock signal and the address signal. Because of a delay caused by these buffers, the clock signal received by the memory device may be out of synchronism with the data signal to be stored. In order to avoid this, a conventional system employs a low-frequency clock signal such that the delay caused by the buffers can be ignored. Namely, the buffer delay conventionally places a cap on a maximum clock frequency usable in the system.

In response, a system as will be described below has been proposed.

Figure 16:
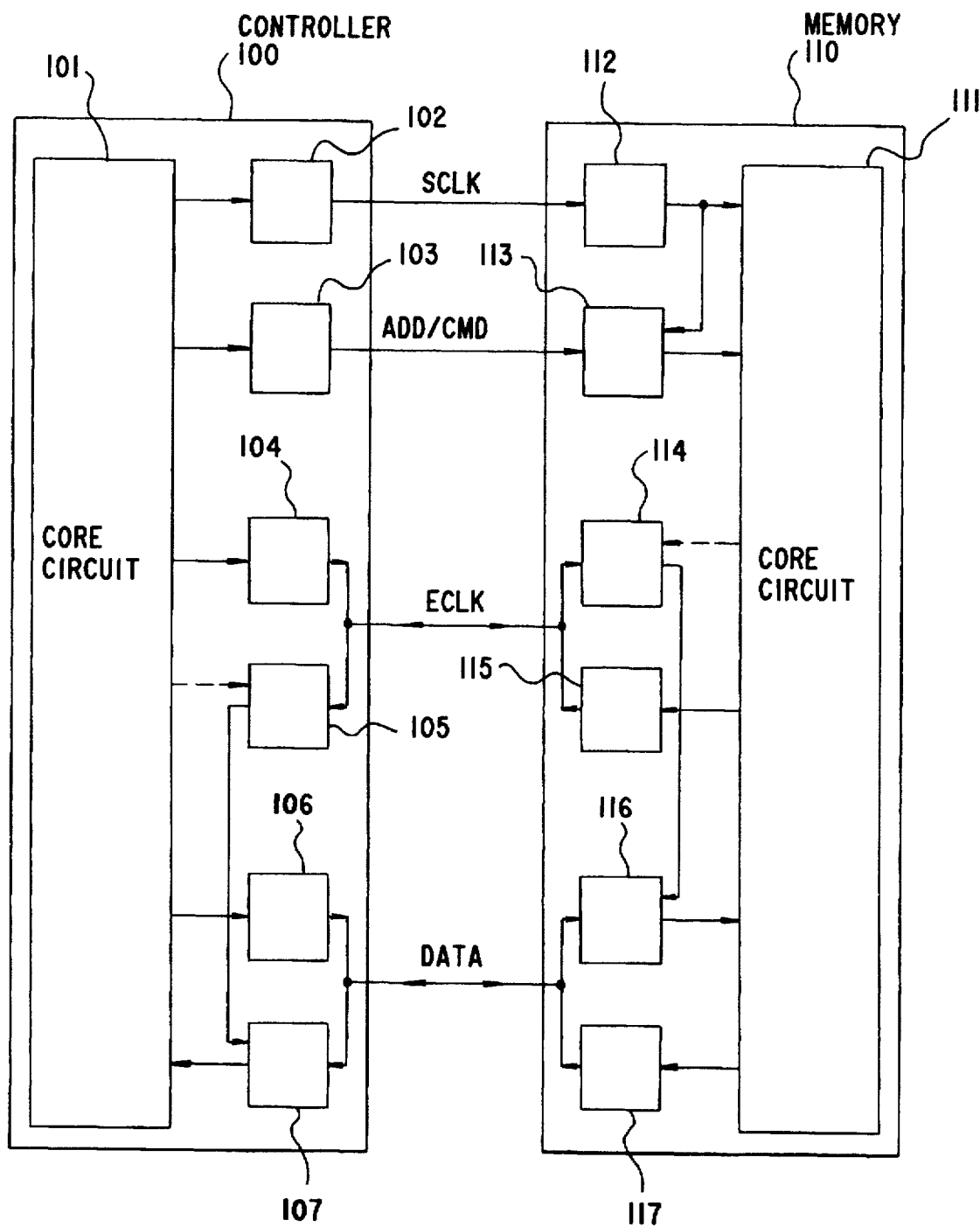
FIG. 16 is a block diagram of a system which uses two clock signals.

FIG. 16 is a block diagram of a system which uses two clock signals. The system of FIG. 16 includes a controller 100 and a memory 110. The controller 100 includes a core circuit 101, a system-clock-output circuit 102, an address/ command-output circuit 103, an echo-clock-output circuit 104, an echo-clock-input circuit 105, a data-output circuit 106, and a data-input circuit 107. The memory 110 includes a core circuit 111, a system-clock-input circuit 112, an address/command-input circuit 113, an echo-clock-input circuit 114, an echo-clock-output circuit 115, a data-input circuit 116, and a data-output circuit 117.

In the controller 100, the core circuit 101 produces a system-clock signal SCLK, and supplies it to the system-clock-output circuit 102. Also, the core circuit 101 generates an address/command signal ADD/CMD in synchronism with the system-clock signal SCLK, and provides it to the address/command-output circuit 103. The system-clock signal SCLK is supplied to the system-clock-input circuit 112 of the memory 110 by the system-clock-output circuit 102 of the controller 100. The address/command signal ADD/CMD is provided to the address/command-input circuit 113 of the memory 110 by the address/command-output circuit 103 of the controller 100. In the memory 110, the address/command-input circuit 113 receives the address/command signal ADD/CMD in synchronism with the system-clock signal SCLK supplied from the system-clock-input circuit 112. The system-clock signal SCLK received by the system-clock-input circuit 112 and the address/command signal ADD/CMD received by the address/command-input circuit 113 are fed to the core circuit 111 of the memory 110.

First, a data-write operation will be described. In the controller 100, the core circuit 101 generates an echo-clock signal ECLK which is supplied to the echo-clock-output circuit 104, and produces a data signal DATA in synchronism with the echo-clock signal ECLK to supply it to the data-output circuit 106. The echo-clock signal ECLK is provided to the echo-clock-input circuit 114 of the memory 110 via the echo-clock-output circuit 104 of the controller 100. The data signal DATA is supplied to the data-input circuit 116 of the memory 110 via the data-output circuit 106 of the controller 100. In the memory 110, the data-input circuit 116 receives the data signal DATA in synchronism with the echo-clock signal ECLK from the echo-clock-input circuit 114. The data signal DATA received by the data-input circuit 116 is supplied to the core circuit 111 of the memory 110.

Next, a data-read operation will be described. In the memory 110, the core circuit 111 produces the echo-clock signal ECLK to supply it to the echo-clock-output circuit 115, and, also, generates the data signal DATA in synchronism with the echo-clock signal ECLK to provide it to the data-output circuit 117. The echo-clock-output circuit 115 of the memory 110 sends the echo-clock signal ECLK to the echo-clock-input circuit 105 of the controller 100. The data-output circuit 117 of the memory 110 transmits the data signal DATA to the data-input circuit 107 of the controller 100. In the controller 100, the data-input circuit 107 receives the data signal DATA in synchronism with the echo-clock signal ECLK from the echo-clock-input circuit 105. The data signal DATA received by the data-input circuit 107 is then transferred to the core circuit 101 of the controller 100.

In this manner, the system-clock signal SCLK used for inputting the address/command signal ADD/CMD is provided separately from the echo-clock signal ECLK used for inputting/outputting the data signal DATA, so that the problem of the buffer delay putting a limit on the clock-signal frequency can be overcome. That is, since the echo-clock signal ECLK is provided for exclusive use for data input/output, the system-clock signal SCLK is no longer required to be in synchronism with the data signal DATA.

In this system, however, the problem of the intermediate voltage level as shown in FIG. 11 is present. In particular, since the echo-clock signal ECLK is transmitted in two ways rather than in one way, the echo-clock signal ECLK is bound to have an intermediate voltage level during a switching period of the echo-clock signal ECLK.

As previously shown in FIG. 12, the control of the input buffer by the control signal FLAG as to whether the input buffer is powered on can avoid the problem of the intermediate voltage level. In the device of FIG. 12, the control signal FLAG is provided externally to control the input buffer. If this configuration is applied to the system of FIG. 16, the controller 100 provides the control signal FLAG to the memory 110, and the memory 110 controls the system-clock-input circuit 112 based on the control signal FLAG. As for the echo-clock signal ECLK, a control signal may be generated inside the memory 110 to control the echo-clock-input circuit 114 based on this control signal. The same applies to the controller 100, so that the controller 100 may generate a control signal internally to control the echo-clock-input circuit 105.

Figure 17:
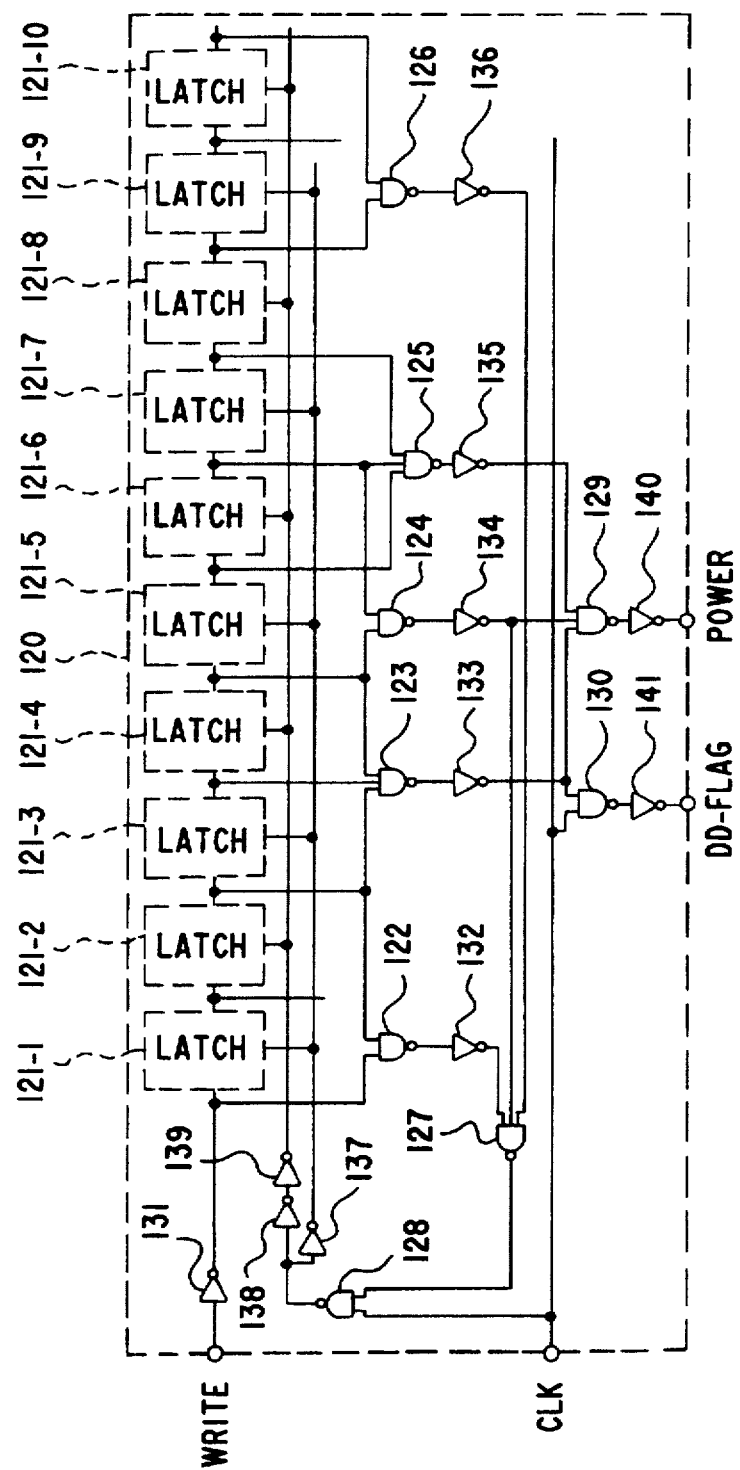
FIG. 17 is a circuit diagram of an example of a circuit which generates a control signal for power control.

FIG. 17 is a circuit diagram of an example of a circuit which generates a control signal for the power control. A control-signal generation circuit 120 of FIG. 17 includes latches 121-1 through 121-10, NAND circuits 122 through 130, and inverters 131 through 141. In FIG. 17, a generation of the control signal when data is written into the memory 110 of FIG. 16 is shown as an example.

The latches 121-1 through 121-10 are connected in series to comprise a shift register. The odd-numbered latches receive the clock signal CLK via the NAND circuit 128 and the inverter 137. The even-numbered latches are provided with an inverse of the clock signal CLK via the NAND circuit 128 and the inverters 138 and 139. Thus, the shift register comprised of latches 121-1 through 121-10 shifts the data to the right once in every half a cycle of the clock signal CLK. The shift register stores a write signal WRITE provided via the inverter 131.

The NAND circuits 122 through 126 detect an appropriate timing based on the write signal WRITE stored in the shift register. The detected timing is provided to the NAND circuit 127 via the inverters 132, 134, and 136. An output of the NAND circuit 127 is given to one input of the NAND circuit 128, and the other input of the NAND circuit 128 receives the clock signal CLK. In this manner, the shift register does not accept a new write signal WRITE at the timing detected by the NAND circuits 122, 124, and 126.

The timing detected by the NAND circuits 123 through 125 is provided to the NAND circuit 129 via the corresponding inverters 133 through 135. An output of the NAND circuit 129 is inverted by the inverter 140 to generate a power-control signal POWER. The timing detected by the NAND circuit 123 is provided to one input of the NAND circuit 130, and the other input of the NAND circuit 130 receives the clock signal CLK. An output of the NAND circuit 130 is inverted by the inverter 141 to produce a control signal DD-FLAG which indicates timing of the data-read-in operation. A detailed description of the control signal DD-FLAG will be provided later.

The power-control signal POWER thus generated controls the echo-clock-input circuit 114 of FIG. 16. In FIG. 16, the power control for the echo-clock-input circuit 114 is shown by a dotted line extending from the core circuit 111. By providing a circuit similar to that of FIG. 17 for each command, the timing of generating the power-control signal POWER (and the control signal DD-FLAG) can be obtained based on a command given to the memory 110 (the write command WRITE is given in the example of FIG. 17). Also, circuits similar to that of FIG. 17 can be used in the controller 100 of FIG. 16. Power control for the echo-clock-input circuit 105 is shown by a dotted line extending from the core circuit 101 of the controller 100.

Figure 18:
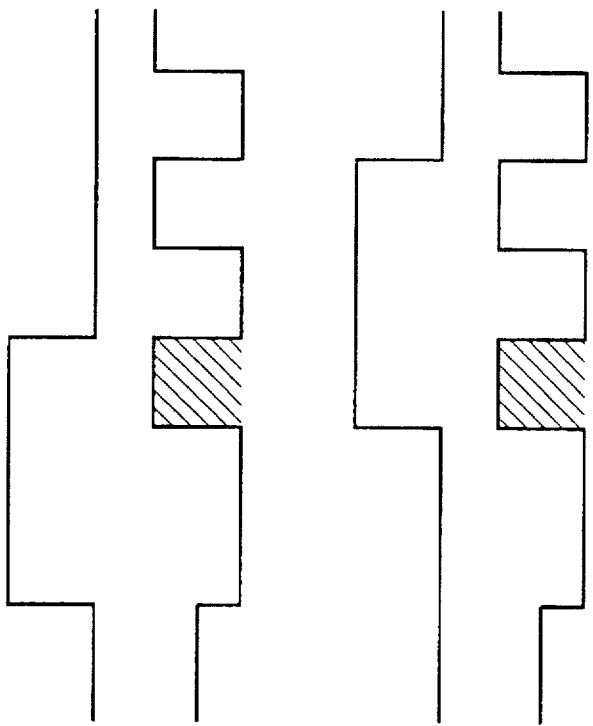
FIGS. 18A through 18D are time charts showing timing relations between a control signal and an echo-clock signal.

FIGS. 18A through 18D are time charts showing timing relations between the control signal DD-FLAG and the echo-clock signal ECLK. FIGS. 18A and 18B show different timing relations from those of FIGS. 18C and 18D.

The control signal DD-FLAG indicates a start timing of a data-read operation when the data signal DATA is read in synchronism with the echo-clock signal ECLK. In the following description, a pulse length of the echo-clock signal ECLK is referred to as one cycle. The control signal DD-FLAG has a duration longer than one cycle and shorter than one cycle plus the LOW period of the echo-clock signal ECLK which lasts between an end of an intermediate voltage level and a start of the following HIGH level. Each of FIGS. 18A and 18C shows an acceptable maximum length of the control signal DD-FLAG, i.e., one cycle plus the duration of the LOW period of the echo-clock signal ECLK. In each of FIGS. 18B and 18D, the echo-clock signal ECLK maintains LOW for two cycles following the intermediate voltage level, and turns to HIGH after these two cycles of the LOW level. In this case, the acceptable maximum length of the control signal DD-FLAG is three cycles (one cycle plus two cycles) as shown in FIGS. 18A and 18C.

The timing to start reading the data signal DATA is determined by taking a logical AND operation between the control signal DD-FLAG and the echo-clock signal ECLK, and a first change from logical zero to logical one in the result of the AND operation indicates the timing to start the data reading. In FIGS. 18A and 18B or FIGS. 18C and 18D, the data-read operation of the data signal DATA starts at the timing indicated by a hatched clock pulse of the echo-clock signal ECLK. As can be seen from a comparison between FIGS. 18A and 18B and FIGS. 18C and 18D, the control signal DD-FLAG allows two cycles of skew (timing error) when the control signal DD-FLAG has the acceptable maximum length. Namely, when the circuit of FIG. 17 generates the control signal DD-FLAG to define the timing of starting the data-read operation of the data signal DATA, the echo-clock signal ECLK provided from the controller 100 to the memory 110 can have a timing error by as much as two cycles with respect to the control signal DD-FLAG generated inside the memory 110. This tolerance to skew makes the designing of the system much easier.

In the circuit of FIG. 17, the timing to output the control signal DD-FLAG is determined by wire connections inside the circuit, and, thus, is deterministic. Alternately, this timing can be varied under the control of programs.

Figure 19:
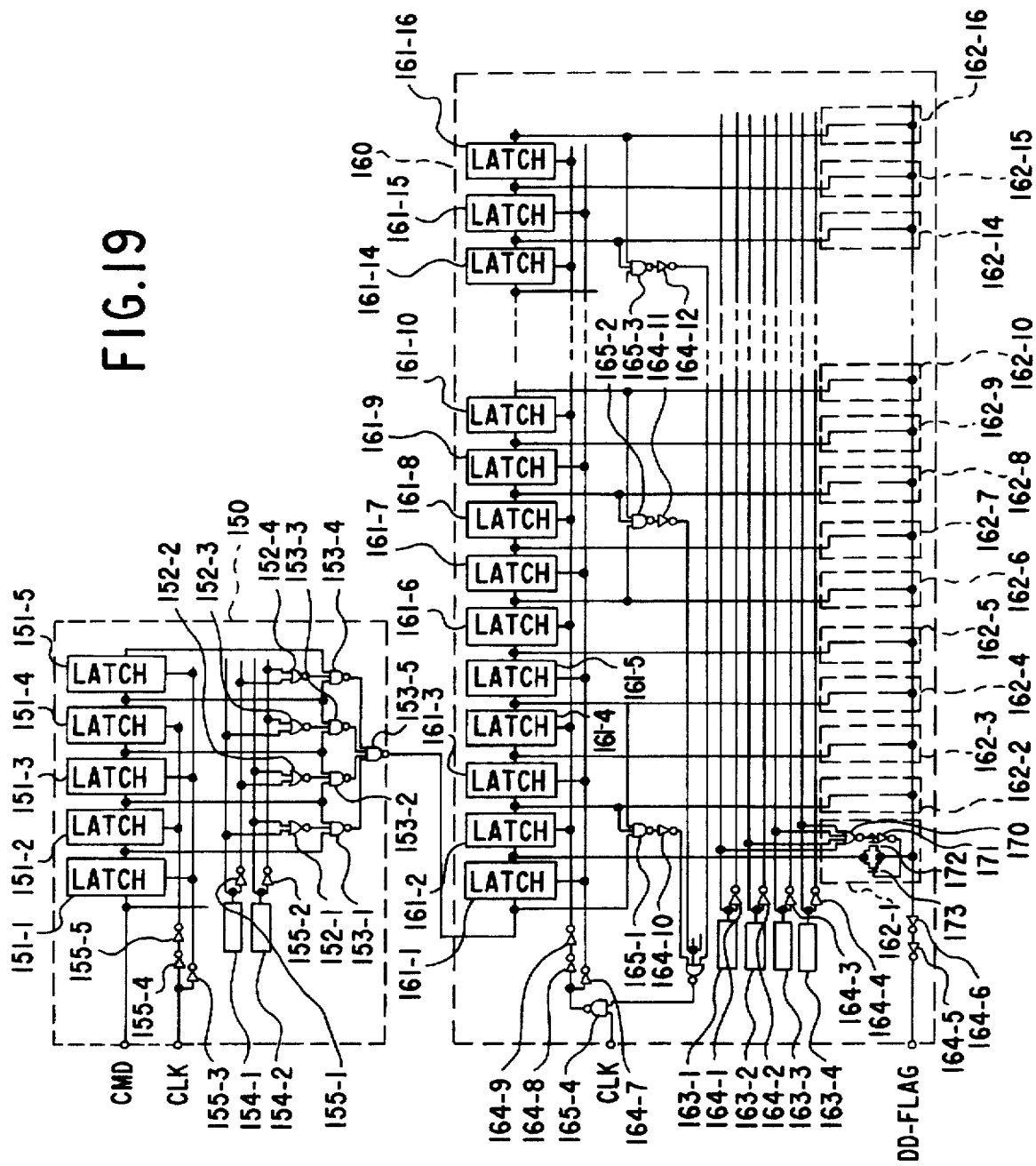
FIG. 19 is a circuit diagram of an example of a circuit which can control the timing of the control signal based on programs.

FIG. 19 is a circuit diagram of an example of a circuit which can control the timing of the control signal DD-FLAG based on programs. The circuit of FIG. 19 includes a first timing circuit 150 and a second timing circuit 160.

The first timing circuit 150 includes latches 151-1 through 151-5, NOR circuits 152-1 through 152-4, NAND circuits 153-1 through 153-5, registers 154-1 and 154-2, and inverters 155-1 through 155-5.

The latches 151-1 through 151-5 are connected in series to make up a shift register as in the circuit of FIG. 17. The clock signal CLK is provided to the latches 151-1 through 151-5 via either the inverter 155-3 or the inverters 155-4 and 155-5. A command CMD read by the shift register is shifted to the right once in every half a cycle. The NAND circuits 153-1 through 153-4 receive data stored in the shift register, and detect appropriate timings based on the received data.

The registers 154-1 and 154-2 store data which selects a predetermined timing. The data stored in the registers 154-1 and 154-2 is decoded by the NOR circuits 152-1 through 152-4, and the decoded result activates one of the NAND circuits 153-1 through 153-4 which corresponds to the predetermined timing. A signal of the selected timing is then supplied to the second timing circuit 160 via the NAND circuit 153-5.

The second timing circuit 160 includes latches 161-1 through 161-16, switch circuits 162-1 through 162-16, registers 163-1 through 163-4, inverters 164-1 through 164-12, and NAND circuits 165-1 through 165-4. In the second timing circuit 160, elements other than the registers 163-1 through 163-4 and the switch circuits 162-1 through 162-16 are functionally the same as those of the circuit of FIG. 17, and a description thereof will be omitted.

Data stored in the registers 163-1 through 163-4 determines a predetermined timing. The data stored in the registers 163-1 through 163-4 and an inverse thereof from the inverters 164-1 through 164-4 are provided to the switch circuits 162-1 through 162-16 through respective decoding combinations.

Each of the switch circuits 162-1 through 162-16 includes a NOR circuit 170, an inverter 171, an N-type FET 172, and a P-type FET 173. The NOR circuit 170 receives the data (and/or the inverse thereof) stored in the registers 163-1 through 163-4. The inverter 171 receives an output of the NOR circuit 170. The N-type FET 172 and the P-type FET 173 are driven by the NOR circuit 170 and the inverter 171, respectively. When all the inputs to the NOR circuit 170 are LOW, the N-type FET 172 and the P-type FET 173 are turned on. In this manner, one of the outputs from the latches 161-1 through 161-16 which corresponds to the turned-on switch circuit is output as the control signal DD-FLAG via the inverters 164-5 and 164-6.

In this manner, the DD-FLAG generation timing is controlled based on the data stored in registers. Since programs (stored data) can be used for controlling the DD-FLAG generation timing, flexible designing of the system can be achieved.

The control signal DD-FLAG can tolerate a timing error to some extent as previously described with reference to FIGS. 18A through 18D. However, when the control signal DD-FLAG and the echo-clock signal ECLK together define the data-read timing of data, this data is allowed to have a timing error only within one cycle.

With reference back to FIG. 16, the core circuit 111 of the memory 110 is operated based on the system-clock signal SCLK. If there is a skew more than one cycle between the echo-clock signal ECLK and the system-clock signal SCLK, the data received based on the echo-clock signal ECLK can not be correctly written in a memory core circuit of the core circuit 111.

Figure 20:
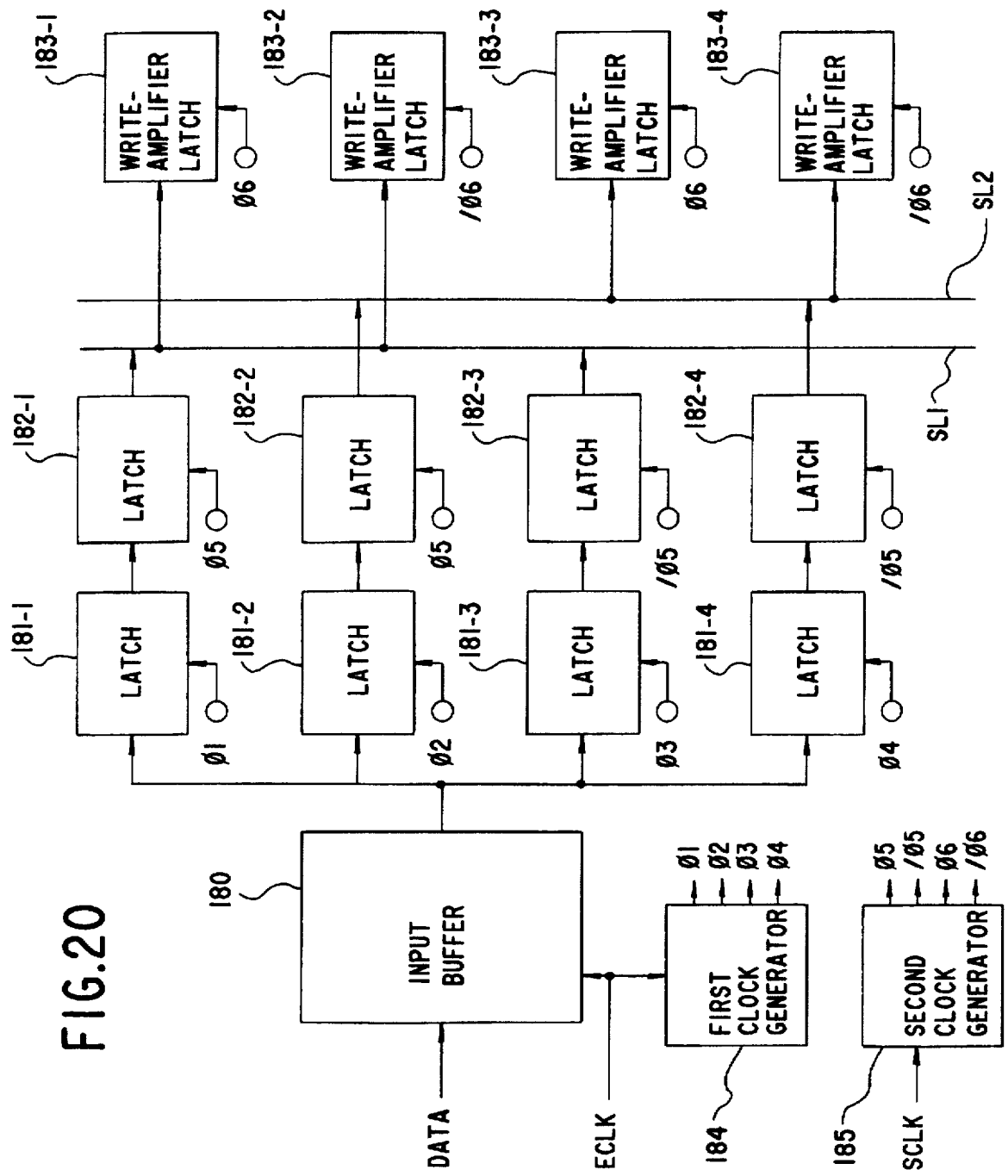
FIG. 20 is a block diagram of a circuit which carries out a serial-to-parallel conversion.
Figure 21:
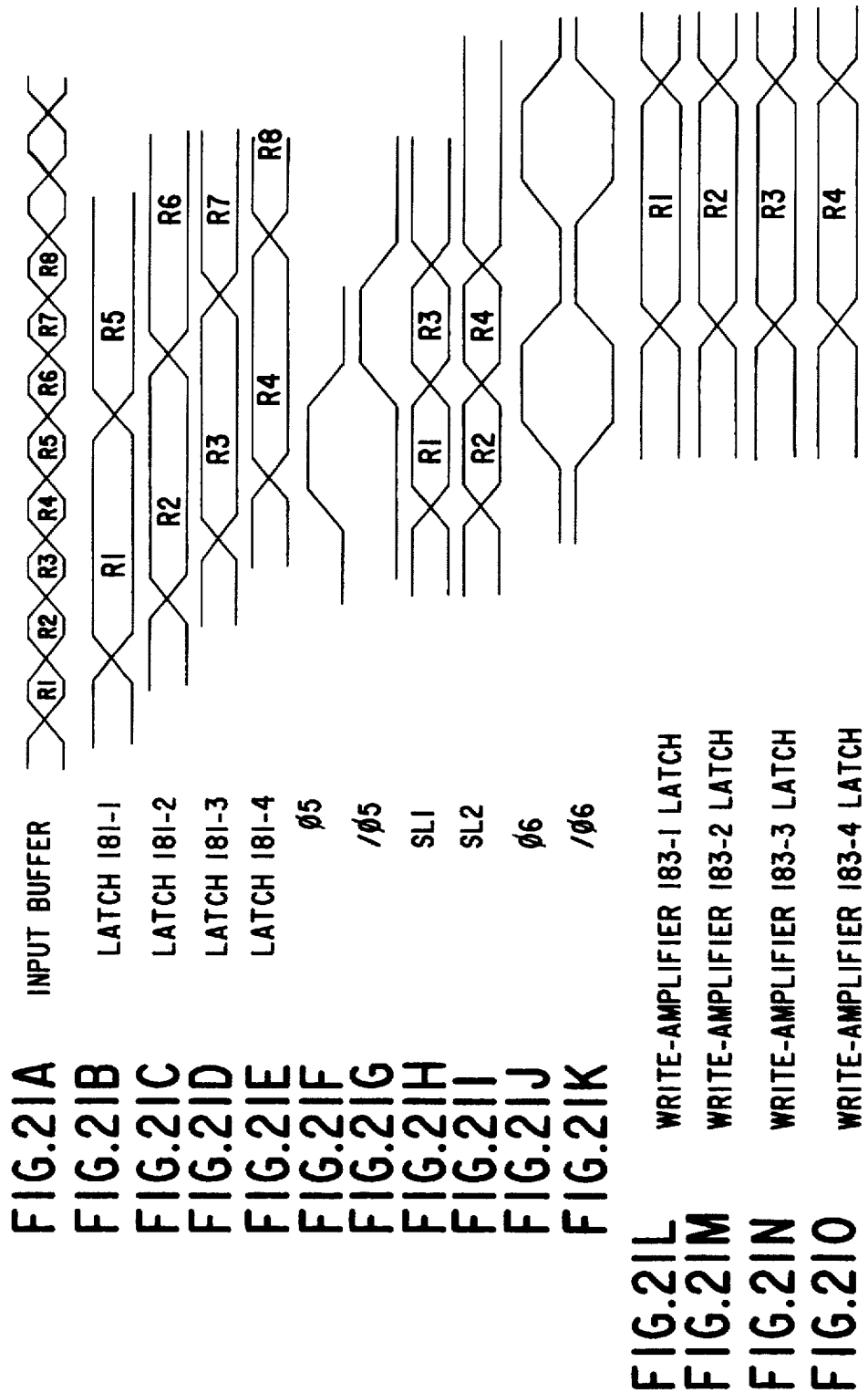
FIGS. 21A through 21O are time charts for explaining the circuit operation of FIG. 20.

In order to obviate this problem, a serial-to-parallel conversion is applied to the received data. FIG. 20 is a block diagram of a circuit which carries out the serial-to-parallel conversion. FIGS. 21A through 21O are time charts for explaining the circuit operation of FIG. 20.

The circuit of FIG. 20 includes an input buffer 180, latches 181-1 through 181-4, latches 182-1 through 182-4, signal lines SL1 and SL2, write-amplifier latches 183-1 through 183-4, a first clock generator 184, and a second clock generator 185.

With reference to FIG. 20 and FIGS. 21A through 21O, the input buffer 180 reads data R1 through R4 successively in synchronism with the echo-clock signal ECLK. The data R1 through R4 are held by the latches 181-1 through 181-4 using clocks Φ1 through Φ4, respectively, which are generated by the first clock generator 184 based on the echo-clock signal ECLK. The data R1 through R4 stored in the latches 181-1 through 181-4, respectively, remain stored therein for four cycles before the next data is received. Because the data R1 through R4 is kept in the latches 181-1 through 181-4, respectively, for a duration more than one cycle, the system-clock signal SCLK can be used to read the data R1 through R4 from the latches 181-1 through 181-4, respectively, even if the system-clock signal SCLK is skewed by more than one cycle from the echo-clock signal ECLK.

In the example of FIG. 20, the second clock generator 185 generates clocks Φ5 and/Φ5 as shown in FIGS. 21F and 21G, respectively, based on the system-clock signal SCLK. These clocks Φ5 and/Φ5 are used by the latches 182-1 through 182-4 to read data from the latches 181-1 through 181-4, respectively. The latches 182-1 and 182-3 output the stored data to the signal line SL1, and the latches 182-2 and 182-4 output the stored data to the signal line SL2. Data on the signal lines SL1 and SL2 are shown in FIGS. 21H and 21I, respectively. As shown in FIGS. 21H and 21I, the data is sequentially output in a predetermined order.

The clock Φ5 can be used for receiving the data R1 and R2 as long as the clock Φ5 appears during a period when the latch 181-1 holds the data R1 and the latch 181-2 holds the data R2. Also, the clock/Φ5 can be used for receiving the data R3 and R4 as long as the clock/Φ5 appears during a period when the latch 181-3 holds the data R3 and the latch 181-4 holds the data R4. Because of this, the timing difference between the system-clock signal SCLK and the echo-clock signal ECLK can be tolerated to some extent.

In the example of FIG. 20, the second clock generator 185 further generates clocks Φ6 and/Φ6 based on the system-clock signal SCLK. The clocks Φ6 and/Φ6 are shown in FIGS. 21J and 21K. Using these clocks Φ6 and/Φ6, the write-amplifier latches 183-1 through 183-4 read the data appearing on the signal lines SL1 and SL2.

The write-amplifier latches 183-1 and 183-3 use a rising edge of the clock Φ6 to read the data, and the write-amplifier latches 183-2 and 183-4 use a rising edge of the clock/Φ6 to read the data. If the data R1 and R2 is shifted based on the clock Φ6 by half a cycle thereof, the data R1 through R4 can be aligned in time as shown in FIGS. 21L through 21O.

In this manner, the serial-to-parallel conversion of the received data helps to achieve correct data detection using the system-clock signal SCLK even if there is a skew between the system-clock signal SCLK and the echo-clock signal ECLK.

With reference back to FIG. 16, the echo-clock signal ECLK is internally generated by the core circuit 111 of the memory 110 during the time of the data-read operation from the memory 110, as previously described. This internally generated echo-clock signal ECLK preferably maintains a predetermined timing with the system-clock signal SCLK.

Figure 22:
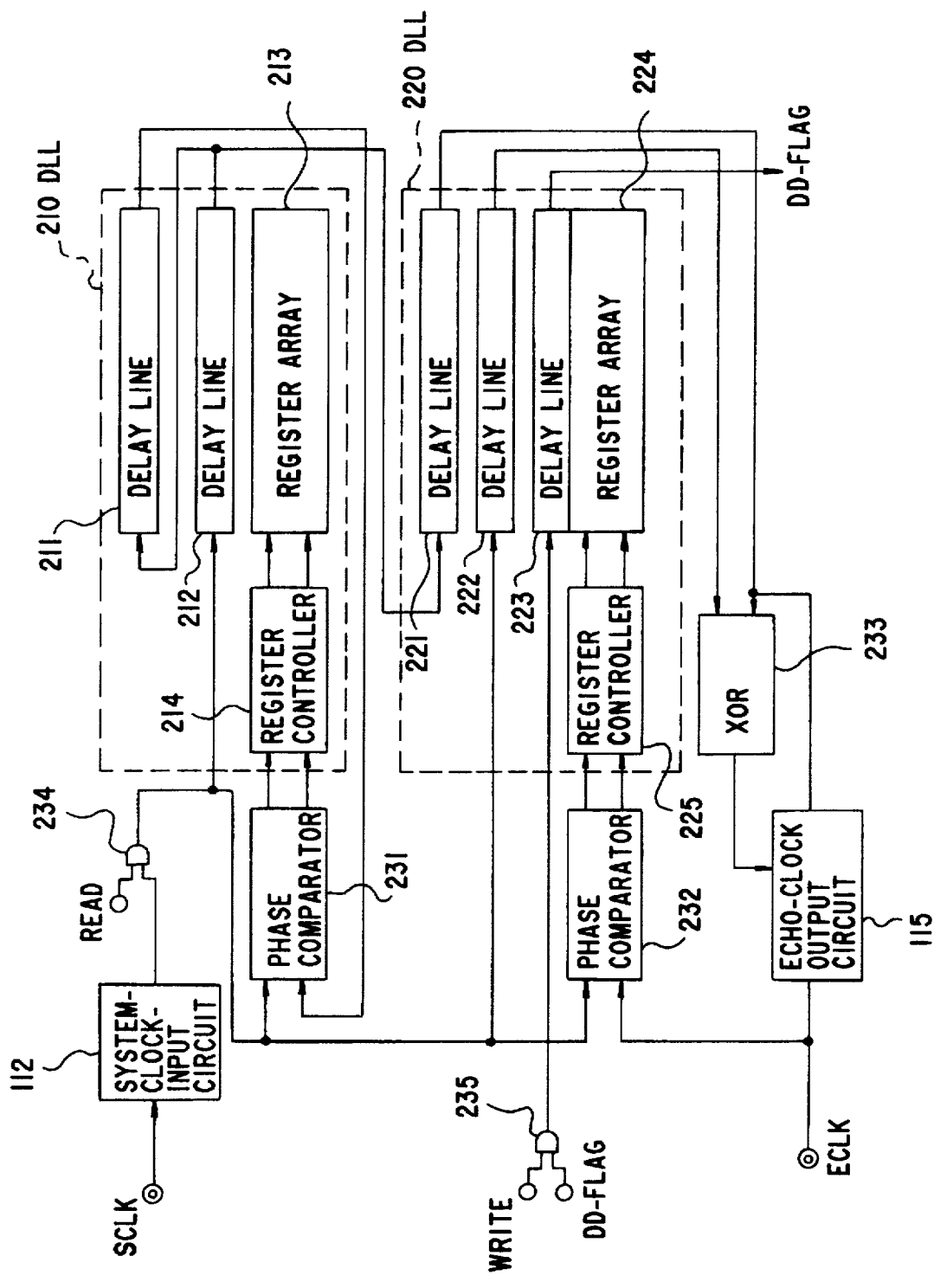
FIG. 22 is a block diagram of a circuit which generates the echo-clock signal of a predetermined phase relation with a system-clock signal.

FIG. 22 is a block diagram of a circuit which generates the echo-clock signal ECLK of a predetermined phase relation with the system-clock signal SCLK. The circuit of FIG. 22 includes the system-clock-input circuit 112 (see FIG. 16), the echo-clock-output circuit 115 (see FIG. 16), DLLs (delay latched loops) 210 and 220, phase comparators 231 and 232, an XOR circuit 233, and AND circuits 234 and 235.

The DLL 210 includes delay lines 211 and 212, a register array 213, and a register controller 214. The register controller 214 receives phase-comparison results from the phase comparator 231, and controls the register array 213 based on the phase-comparison results. The register array 213 adjusts the number of delay elements included in the delay lines 211 and 212 to control a delay of a signal passing through the delay lines 211 and 212. The DLL 210 is used for generating a signal obtained by delaying the system-clock signal SCLK by 180 degrees in phase.

The system-clock signal SCLK detected by the system-clock-input circuit 112 is supplied via the AND circuit 234 to the DLL 210 and the phase comparators 231 and 232. The system-clock signal SCLK supplied to the DLL 210 passes through the delay line 212, and is delayed by a delay time T1. The system-clock signal SCLK of the delay time T1 is supplied to the delay line 211 from the delay line 212, and is further delayed by the delay time T1. An output of the delay line 211 is thus the system-clock signal SCLK having double the delay time T1 (i.e., delay time 2T1). The system-clock signal SCLK of the delay time 2T1 is input to the phase comparator 231. The phase comparator 231 compares phases between system-clock signal SCLK of the delay time 2T1 and the original system-clock signal SCLK, and controls the DLL 210 so as to make the two phases equal. As a result, the delay time 2T1 is adjusted to 360 degrees in phase (one clock cycle). The systemclock signal SCLK having a 180-degree delay (delay time T1) is supplied from the delay line 212 to the DLL 220.

The DLL 220 includes delay lines 221 through 223, a register array 224, and a register controller 225. The register controller 225 receives phase-comparison results from the phase comparator 232, and controls the register array 224 based on the phase-comparison results. The register array 224 adjusts the number of delay elements included in the delay lines 221 through 223 to control a delay of a signal passing through the delay lines 221 through 223.

The system-clock signal SCLK of the 180-degree delay from the DLL 210 is supplied to the delay line 221. The delay line 221 incurs delay time T2 in the system-clock signal SCLK already having the 180 degree delay. As a result, an output of the delay line 221 is the system-clock signal SCLK having a delay time of 180 degrees plus T2. Also, the original system-clock signal SCLK is supplied to the delay line 222 of the DLL 220. The delay line 222 causes the same delay as that of the delay line 221, and outputs the system-clock signal SCLK of the delay time T2.

The system-clock signal SCLK delayed by 180 degrees plus T2 from the delay line 221 and the system-clock signal SCLK delayed by T2 from the delay line 222 are input to the XOR circuit 233. The XOR circuit 233 thus generates the echo-clock signal ECLK having double the frequency of the system-clock signal SCLK and having the delay time T2. This echo-clock signal ECLK is output from the echo-clock-output circuit 115.

The echo-clock signal ECLK output from the echo-clock-output circuit 115 is also supplied to the phase comparator 232. The phase comparator 232 compares phases between the echo-clock signal ECLK having the delay time T2 and the original system-clock signal SCLK, and controls the DLL 220 so as to make the two phases equal. As a result, the delay time T2 is adjusted to 360 degrees (one clock cycle). This adjustment makes the echo-clock signal ECLK have a phase delay of 360 degrees from the system-clock signal SCLK.

As mentioned above, the echo-clock signal ECLK has a frequency twice as much as that of the system-clock signal SCLK. This is because the system of the present invention uses both rising edges and falling edges of the clock signal CLK (i.e., system-clock signal SCLK) in effecting synchronization. The use of both types of edges doubles the operation frequency of internal circuits, so that the echo-clock signal ECLK is required to have double the frequency of the system-clock signal SCLK.

Further, the delay line 223 receives the control signal DD-FLAG via the AND circuit 235, and delays the control signal DD-FLAG by one clock cycle. There is a reason for making a one-clock-cycle delay in the control signal DD-FLAG. The circuit of FIG. 17 generates the control signal DD-FLAG without taking into consideration the delay of the echo-clock signal ECLK. Since there is a one-cycle delay in the echo-clock signal ECLK, the control signal DD-FLAG also needs the same amount of delay.

The AND circuit 234 is used for operating the circuit of FIG. 22 only when a read command Read is given. Also, the AND circuit 235 is used for allowing the passage of the control signal DD-FLAG only when a write command Write is given, so as to let a pertinent part of the circuit operate. The provision of these gates (AND circuits 234 and 235) helps to reduce excessive power consumption.

In this manner, the circuit of FIG. 22 generates the echo-clock signal ECLK which has a predetermined phase relation with the system-clock signal SCLK. In essence, the switching between HIGH and LOW of the echo-clock signal ECLK occurs at the same timing as that of the switching between HIGH and LOW of the system-clock signal SCLK.

The circuit of FIG. 22 is preferably arranged at the center of a chip of the memory 110. That is, it is preferable to divide a memory core of the memory chip into two symmetrical sub-cores and to arrange the circuit of FIG. 22 between these two sub-cores.

Figure 23:
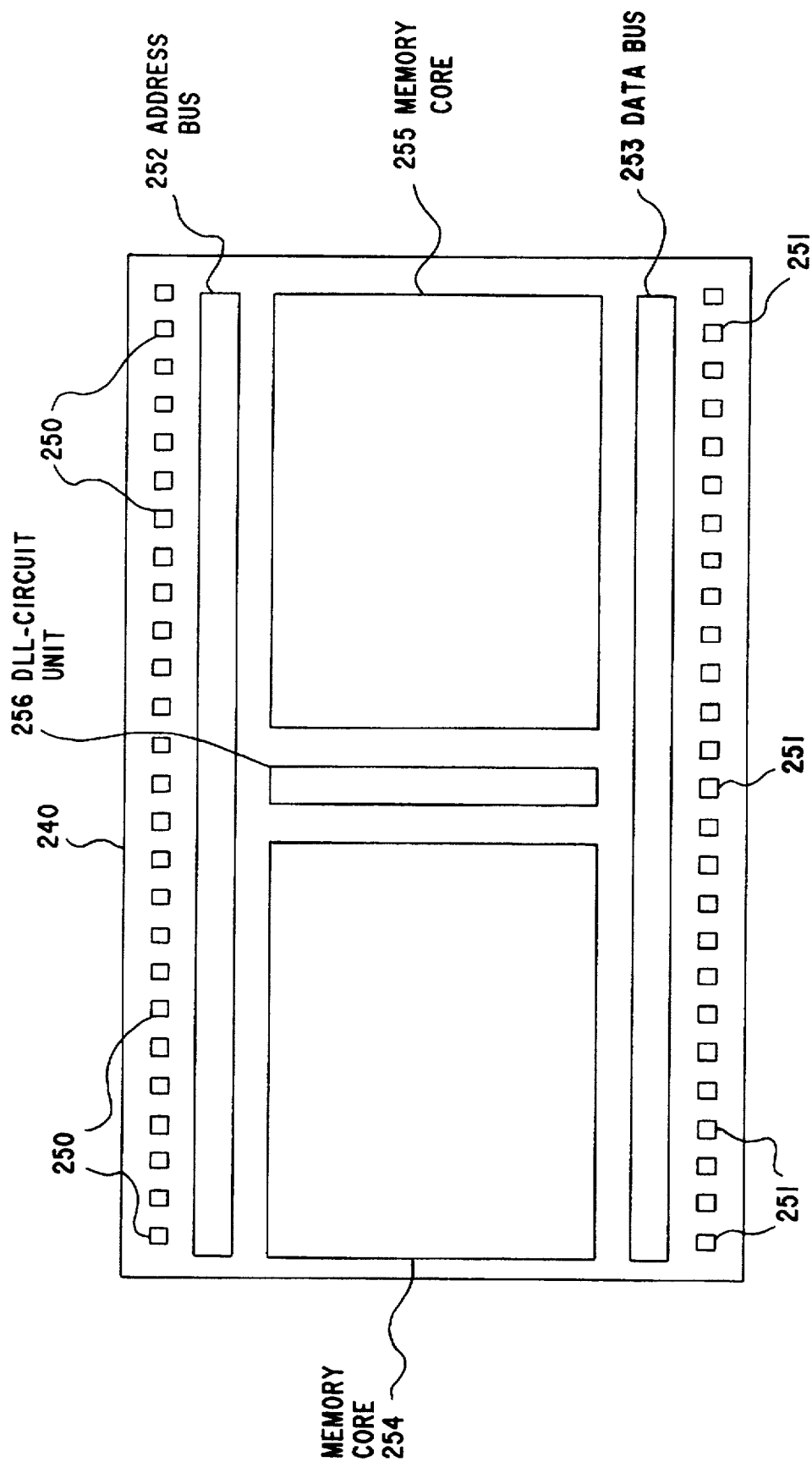
FIG. 23 is an illustrative drawing showing an example of a chip interior arrangement.

FIG. 23 is an illustrative drawing showing an example of a chip interior arrangement. As shown in FIG. 23, a memory chip 240 includes address/command-input pins 250, data-input/output pins 251, an address bus 252, a data bus 253, divided memory cores 254 and 255, and a DLL-circuit unit 256. Address/Command signals input to the address/command-input pins 250 are supplied to the memory cores 254 and 255 via the address bus 252. Data read from or write into the memory cores 254 and 255 is output from or input to the data-input/output pins 251, respectively, via the data bus 253.

The DLL-circuit unit 256, which is the circuit of FIG. 22, for example, is used for adjusting timing relations between the system-clock signal SCLK and the echo-clock signal ECLK. In FIG. 23, the data on the address bus 252 is in synchronism with the system-clock signal SCLK, and the data on the data bus 253 is synchronized with the echo-clock signal ECLK.

The configuration of FIG. 23 makes it easier to distribute signals from the DLL-circuit unit 256 to various parts within the chip. Since the DLL-circuit unit 256 is used for effecting synchronization of the memory cores 254 and 255, the system-clock signal SCLK can be propagated in a direction of the signal flow.

FIG. 23 has the configuration in which the memory core is divided into two units. However, the memory core may be divided into more than two sub-cores, and the DLL-circuit units may be placed at each gap between these sub-cores. This configuration achieves the same advantages described above.

In the above, descriptions have been given with respect to the configurations for controlling timings between different synchronizations when a system uses two different clock signals. An example of a system implementation when using two different clock signals will be provided below.

Figure 24A:
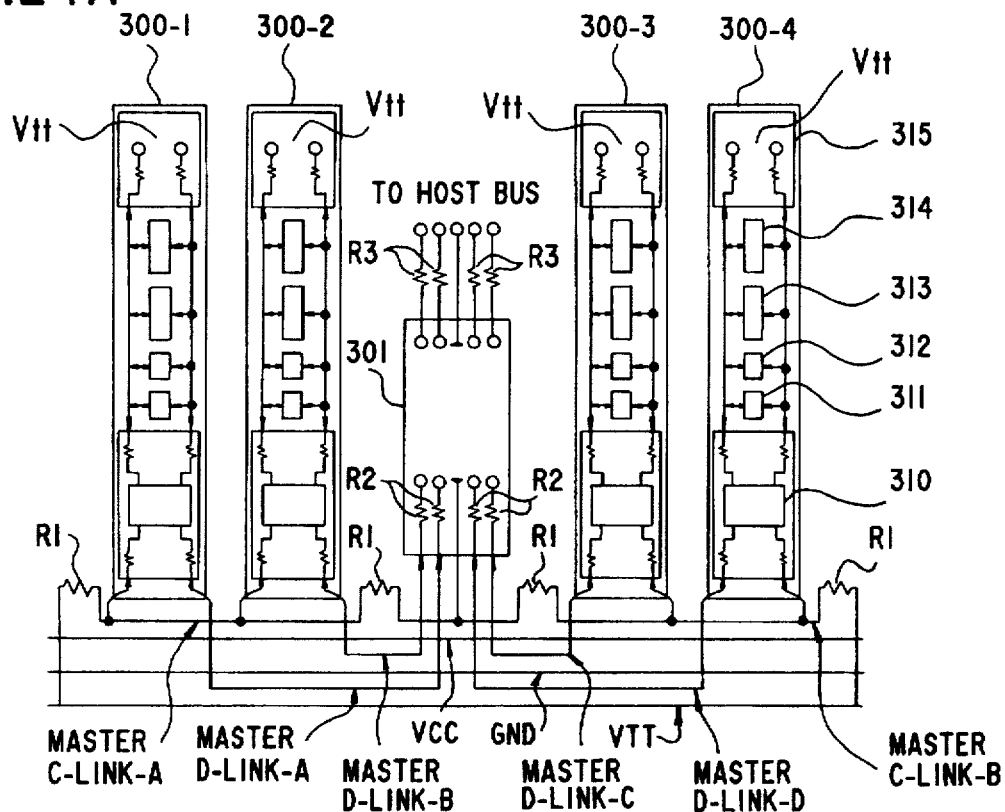
FIGS. 24A through 24C are illustrative drawings showing an example of a system which performs command transfer and data transfer using two clocks.
Figure 24B:
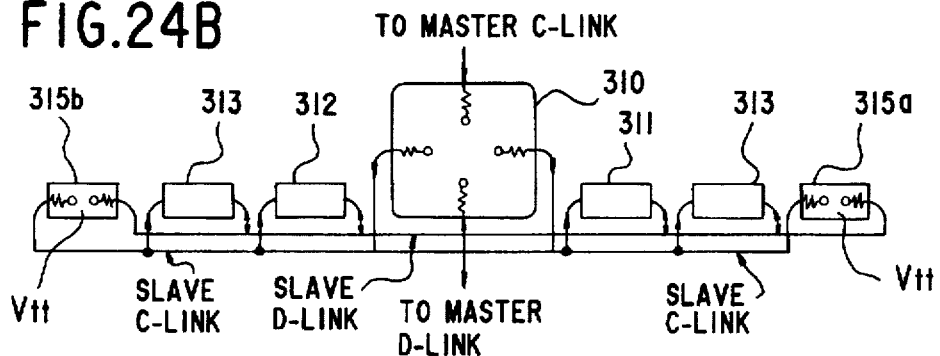
Figure 24C:
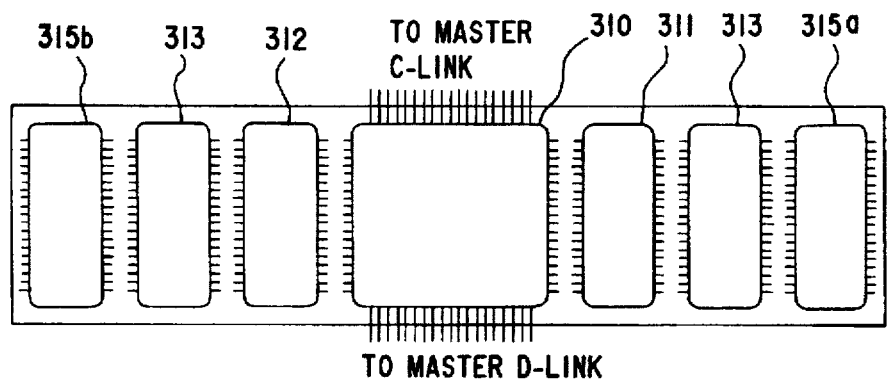

FIGS. 24A through 24C are illustrative drawings showing an example of a system which performs command transfer and data transfer using two clocks. A system of FIG. 24A includes a buffer 301 connected to a host bus (not shown) via resistances R3, master links Master-C-Link-A and Master-C-Link-B connected to the buffer 301 via resistances R1, master links Master-D-Link-A, Master-D-Link-B, Master-D-Link-C, and Master-D-Link-D connected to the buffer 301 via resistances R2, and memory modules 300-1 through 300-4 connected to respective master links. Each of the memory modules 300-1 through 300-4 includes a register buffer 310, memory chips 311 and 312, sockets 313 and 314, and a register IC 315 (315a and 315b in FIGS. 24B and 24C). FIG. 24B shows a configuration inside one of the memory modules 300-1 through 300-4. FIG. 24C is a plan view of the configuration shown in FIG. 24B.

In FIGS. 24A through 24C, signal lines for transferring the system-clock signal SCLK, the address signal ADD, and the command signal CMD are shown as the master links Master-C-Link-A and Master-C-Link-B and a slave link Slave-C-Link. Also, signal lines for transferring the echo-clock signal ECLK and the data signal DATA are shown as the master links Master-D-Link-A, Master-D-Link-B, Master-D-Link-C, and Master-D-Link-D and a slave link Slave-D-Link. Between the master links and the slave links is provided the register buffer 310 for driving long extending signal lines. The configuration of FIGS. 24A through 24C may seem different from the configuration of FIG. 16, but it performs the same operations as the configuration of FIG. 16 if selecting one of the memory chips and ignoring the register buffer 310.

Further, the present invention is not limited to these embodiments, but various variations and modifications may be made without departing from the scope of the present invention.

What is claimed is:

1. An input buffer circuit comprising:
    a first amplifier causing a first change in an output signal by detecting a rising edge of an input signal;
    a second amplifier causing a second change in said output signal by detecting a falling edge of said input signal; and
    a feedback path feeding back said output signal as a feedback signal to said first amplifier and said second amplifier,
    wherein said feedback signal controls said second amplifier such that a timing of said first change only depends on said first amplifier, and controls said first amplifier such that a timing of said second change only depends on said second amplifier.

2. The input buffer circuit as claimed in claim 1, wherein said first amplifier comprises first means for controlling an amount of a first electric current driving said first amplifier, said second amplifier comprises second means for controlling an amount of a second electric current driving said second amplifier, said first means and said second means controlling said amount of said first electric current and said amount of said second electric current, respectively, based on said feedback signal.

3. The input buffer circuit as claimed in claim 2, wherein said first means decreases said amount of said first electric current during a period from said first change to said second change, and wherein said second means decreases said amount of said second electric current during a period from said second change to said first change.

4. The input buffer circuit as claimed in claim 3, wherein said first means and said second means allows presence of at least some current when decreasing said amount of said first electric current and said amount of said second electric current, respectively.

5. The input buffer circuit as claimed in claim 3, wherein said first amplifier comprises a differential amplifier using an N-type FET as an input gate, and said second amplifier comprises a differential amplifier using a P-type FET as an input gate.

6. The input buffer circuit as claimed in claim 3, wherein said first amplifier comprises a current-mirror amplifier using an N-type FET as an input gate, and said second amplifier comprises a current-mirror amplifier using a P-type FET as an input gate.

7. The input buffer circuit as claimed in claim 3, further comprising a latch circuit latching said output signal.

8. An integrated-circuit device receiving a first input signal, said integrated-circuit device comprising:

a first amplifier causing a first change in a detection signal by detecting a rising edge of said first input signal;

a second amplifier causing a second change in said detection signal by detecting a falling edge of said first input signal;

a feedback path feeding back said detection signal as a feedback signal to said first amplifier and said second amplifier, said feedback signal controlling said second amplifier such that a timing of said first change only depends on said first amplifier, and controlling said first amplifier such that a timing of said second change only depends on said second amplifier; and a circuit operating in synchronism with changes in said detection signal corresponding to said first change and said second change.

9. The integrated-circuit device as claimed in claim 8, wherein said circuit comprises an input circuit latching a second input signal.

10. The integrated-circuit device as claimed in claim 9, wherein said circuit comprises:

a first latch circuit latching said second input signal in response to said first change; and a second latch circuit latching said second input signal in response to said second change.

11. The integrated-circuit device as claimed in claim 8, further comprising a control-signal receiving circuit which receives a control signal for controlling said first amplifier and said second amplifier as to whether said first amplifier and said second amplifier operate, so that a timing to start receiving said first input signal can be controlled.

12. The integrated-circuit device as claimed in claim 11, further comprising:

means for determining whether a first edge of said first input signal detected immediately after starting to receive said first input signal is a rising edge or a falling edge; and means for providing said detection signal to said circuit when said first edge is a rising edge, and for providing an inverse of said detection signal to said circuit when said first edge is a falling edge.

13. An integrated-circuit device receiving an input signal, said integrated-circuit device comprising:

a first amplifier causing a first change in a detection signal by detecting a rising edge of said input signal;

a second amplifier causing a second change in said detection signal by detecting a falling edge of said input signal;

a feedback path feeding back said detection signal as a feedback signal to said first amplifier and said second amplifier, said feedback signal controlling said first amplifier to reduce an amount of a driving current thereof during a period from said first change to said second change such that a timing of said second change only depends on said second amplifier, and controlling said second amplifier to reduce an amount of a driving current thereof during a period from said second change to said first change such that a timing of said first change only depends on said first amplifier;

a circuit operating in synchronism with changes in said detection signal corresponding to said first change and said second change; and a control-signal receiving circuit receiving a control signal to control said first amplifier and said second amplifier as to whether said first amplifier and said second amplifier are turned on, so that said control signal controls a timing to start inputting said first input signal.

14. An integrated-circuit device receiving an input signal, said integrated-circuit device comprising:

a first amplifier causing a first change in a detection signal by detecting a rising edge of said input signal;

a second amplifier causing a second change in said detection signal by detecting a falling edge of said input signal; and a feedback path feeding back said detection signal as a feedback signal to said first amplifier and said second amplifier, said feedback signal controlling said second amplifier such that a timing of said first change only depends on said first amplifier, and controlling said first amplifier such that a timing of said second change only depends on said second amplifier, wherein said first amplifier, said second amplifier, and said feedback path together form an input buffer of said integrated-circuit device.

15. A semiconductor memory device receiving a first input signal, said semiconductor memory device comprising:

a first amplifier causing a first change in a detection signal by detecting a rising edge of said first input signal;

a second amplifier causing a second change in said detection signal by detecting a falling edge of said first input signal;

a feedback path feeding back said detection signal as a feedback signal to said first amplifier and said second amplifier, said feedback signal controlling said second amplifier such that a timing of said first change only depends on said first amplifier, and controlling said first amplifier such that a timing of said second change only depends on said second amplifier;

a circuit operating in synchronism with changes in said detection signal corresponding to said first change and said second change, said circuit having a first latch circuit latching a second input signal in response to said first change, and having a second latch circuit latching said second input signal in response to said second change; and a memory core circuit for storing said second input signal.

16. A semiconductor memory device receiving a first input signal, said integrated-circuit device comprising:

a first amplifier causing a first change in a detection signal by detecting a rising edge of said first input signal;

a second amplifier causing a second change in said detection signal by detecting a falling edge of said first input signal;

a feedback path feeding back said detection signal as a feedback signal to said first amplifier and said second amplifier, said feedback signal controlling said second amplifier such that a timing of said first change only depends on said first amplifier, and controlling said first amplifier such that a timing of said second change only depends on said second amplifier;

a control-signal receiving circuit which receives a control signal for controlling said first amplifier and said second amplifier as to whether said first amplifier and said second amplifier operate, so that a timing to start receiving said first input signal can be controlled;

a circuit receiving a second input signal by operating in synchronism with changes in said detection signal corresponding to said first change and said second change; and a memory core circuit for storing said second input signal.

* * * * *